United States Patent
Keigler et al.

(10) Patent No.: US 8,512,543 B2
(45) Date of Patent: Aug. 20, 2013

(54) METHOD FOR FLUID PROCESSING A WORKPIECE

(75) Inventors: Arthur Keigler, Wellesley, MA (US);
John Harrell, Paxton, MA (US);
Zhenqiu Liu, Northboro, MA (US);
Qunwei Wu, Westford, MA (US)

(73) Assignee: Tel Nexx, Inc., Billerica, MA (US)

( * ) Notice: Subject to any disclaimer, the term of this patent is extended or adjusted under 35 U.S.C. 154(b) by 109 days.

(21) Appl. No.: 12/963,991

(22) Filed: Dec. 9, 2010

(65) Prior Publication Data
US 2011/0139627 A1    Jun. 16, 2011

Related U.S. Application Data

(62) Division of application No. 10/971,726, filed on Oct. 22, 2004.

(60) Provisional application No. 60/513,761, filed on Oct. 22, 2003.

(51) Int. Cl.
*C25D 5/08* (2006.01)
*C25D 7/12* (2006.01)
*H01L 21/00* (2006.01)

(52) U.S. Cl.
USPC ............ 205/148; 134/34; 134/188; 204/273; 205/96; 205/123; 216/90

(58) Field of Classification Search
USPC .............................. 205/96, 97, 148; 204/273
See application file for complete search history.

(56) References Cited

U.S. PATENT DOCUMENTS

| | | |
|---|---|---|
| 1,749,953 A | 3/1930 | Lichtman |
| 2,615,692 A | 10/1952 | Muller |
| 3,053,424 A | 9/1962 | Reinhard |
| 3,503,856 A | 3/1970 | Blackmore |
| 4,068,162 A | 1/1978 | Robinson |
| 4,102,756 A | 7/1978 | Castellani et al. |
| 4,304,641 A | 12/1981 | Grandia et al. |
| 4,561,960 A | 12/1985 | Jeannot et al. |
| 4,654,089 A | 3/1987 | Singelyn et al. |
| 4,696,729 A | 9/1987 | Santini |
| 4,964,964 A | 10/1990 | Murphy |
| 5,024,746 A | 6/1991 | Stierman et al. |

(Continued)

OTHER PUBLICATIONS

Andricacos et al., "Future Directions in Electroplated Materials for Thin-Film Recording", 1998, pp. 1-10.

(Continued)

*Primary Examiner* — Patrick Ryan
*Assistant Examiner* — William Leader
(74) *Attorney, Agent, or Firm* — Rothwell, Figg, Ernst & Manbeck, P.C.

(57) ABSTRACT

A method of fluid processing a semiconductor workpiece, including disposing a workpiece holder with a housing capable of containing a fluid, the workpiece holder retaining the workpiece, providing an agitation system connected to the housing and comprising a member disposed within the housing adjacent the workpiece holder, and agitating the fluid by moving the member substantially parallel to a surface of the workpiece with a non-uniform oscillatory motion, the non-uniform oscillatory motion being a series of substantially continuous geometrically asymmetric oscillations wherein each consecutive oscillation of the series is geometrically asymmetric having at least two substantially continuous opposing strokes wherein reversal positions of each substantially continuous stroke of the substantially continuous asymmetric oscillation are disposed asymmetrically with respect to a center point of each immediately preceding substantially continuous stroke of the oscillation.

20 Claims, 20 Drawing Sheets

(56) References Cited

U.S. PATENT DOCUMENTS

| | | |
|---|---|---|
| 5,048,201 A | 9/1991 | Layton |
| 5,227,041 A | 7/1993 | Brogden et al. |
| 5,268,035 A | 12/1993 | Neubauer et al. |
| 5,273,642 A | 12/1993 | Crites et al. |
| 5,312,532 A | 5/1994 | Andricacos et al. |
| 5,342,495 A | 8/1994 | Tung et al. |
| 5,421,987 A | 6/1995 | Tzanavaras et al. |
| 5,429,733 A | 7/1995 | Ishida |
| 5,447,615 A | 9/1995 | Ishida |
| 5,516,412 A | 5/1996 | Andricacos et al. |
| 5,522,975 A | 6/1996 | Andricacos et al. |
| 5,556,479 A | 9/1996 | Bran |
| 5,660,699 A | 8/1997 | Saito et al. |
| 5,683,564 A | 11/1997 | Reynolds |
| 5,807,469 A | 9/1998 | Crafts et al. |
| 5,883,762 A | 3/1999 | Calhoun et al. |
| 5,899,001 A | 5/1999 | Layton |
| 5,927,302 A | 7/1999 | Hayami et al. |
| 6,017,437 A | 1/2000 | Ting et al. |
| 6,036,833 A | 3/2000 | Tang et al. |
| 6,080,291 A | 6/2000 | Woodruff et al. |
| 6,108,932 A | 8/2000 | Chai et al. |
| 6,174,011 B1 | 1/2001 | Keigler |
| 6,193,859 B1 | 2/2001 | Contolini et al. |
| 6,251,250 B1 | 6/2001 | Keigler |
| 6,258,220 B1 | 7/2001 | Dordi et al. |
| 6,334,937 B1 | 1/2002 | Batz, Jr. et al. |
| 6,360,756 B1 | 3/2002 | Chen et al. |
| 6,372,051 B1 | 4/2002 | Adams et al. |
| 6,379,511 B1 | 4/2002 | Fatula et al. |
| 6,495,005 B1 | 12/2002 | Flake et al. |
| 6,502,591 B1 | 1/2003 | Scranton et al. |
| 6,524,461 B2 | 2/2003 | Taylor et al. |
| 6,540,899 B2 | 4/2003 | Keigler |
| 6,547,937 B1 | 4/2003 | Oberlitner et al. |
| 6,685,814 B2 | 2/2004 | Uzoh et al. |
| 6,746,565 B1 | 6/2004 | Bleck et al. |
| 6,749,391 B2 | 6/2004 | Woodruff et al. |
| 6,760,167 B2 | 7/2004 | Meehan et al. |
| 6,776,887 B2 | 8/2004 | Roberts et al. |
| 6,844,274 B2 | 1/2005 | Yoshioka et al. |
| 6,849,970 B2 | 2/2005 | Watanabe |
| 6,911,127 B2 | 6/2005 | Batz, Jr. et al. |
| 6,936,153 B1 | 8/2005 | Ritzdorf |
| 7,022,211 B2 | 4/2006 | Yoshioka et al. |
| 7,097,749 B2 | 8/2006 | Donovan, III et al. |
| 2002/0027080 A1 | 3/2002 | Yoshioka et al. |
| 2002/0132559 A1 | 9/2002 | Togawa |
| 2003/0201184 A1* | 10/2003 | Dordi et al. .................. 205/80 |
| 2004/0245094 A1* | 12/2004 | McHugh et al. ............. 204/253 |
| 2004/0255442 A1 | 12/2004 | McDiarmid et al. |
| 2008/0245669 A1 | 10/2008 | Yoshioka et al. |

OTHER PUBLICATIONS

Brockner et al., "Evolution of Stress and Microstructure in NiFe (20 wt.%) Thin Films During Annealing", Thin Solid Films 385 (20010, pp. 225-229.

Rasmussen et al., "Electroplating and Characterization of Cobalt-Nickel-Iron and Nickel-Iron for Magnetic Microsystems Applications," Science, Sensors and Actuators A 92 (2001), pp. 242-248.

Song et al., "Stress Changes of Binary CoNi Alloy Films Electrodeposited from Different Anions," Abstract from The Electrochemical Society Joint International Meeting, Oct. 5, 2004, 1 page.

Tabakovic et al., "Composition Structure, Stress, and Coercivity of Electrodeposited Soft Magnetic CoNiFe Films", Journal of the Electrochemical Society, 149(1) (2002) pp. C18-C22.

"Automatic loading and unloading (combined)," Ludy Brochure, Mar. 2000.

"Global Support Generates Business," Totally Integrated Automation, 2001.

* cited by examiner

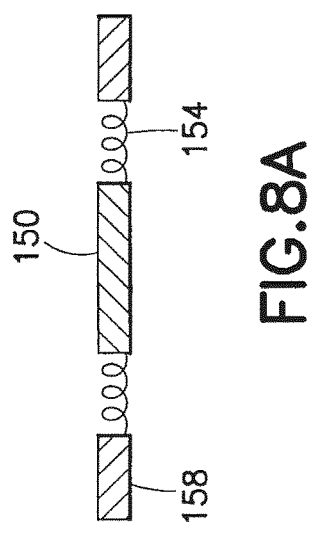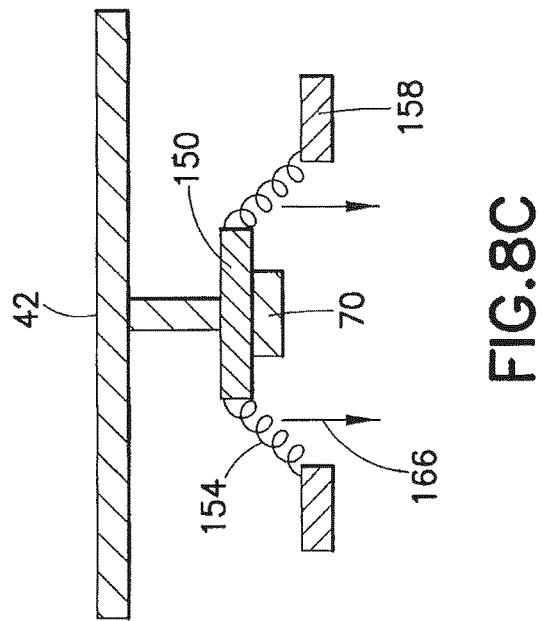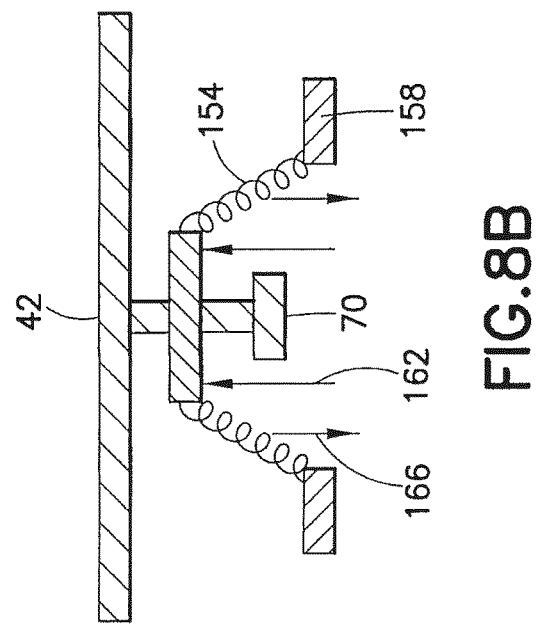

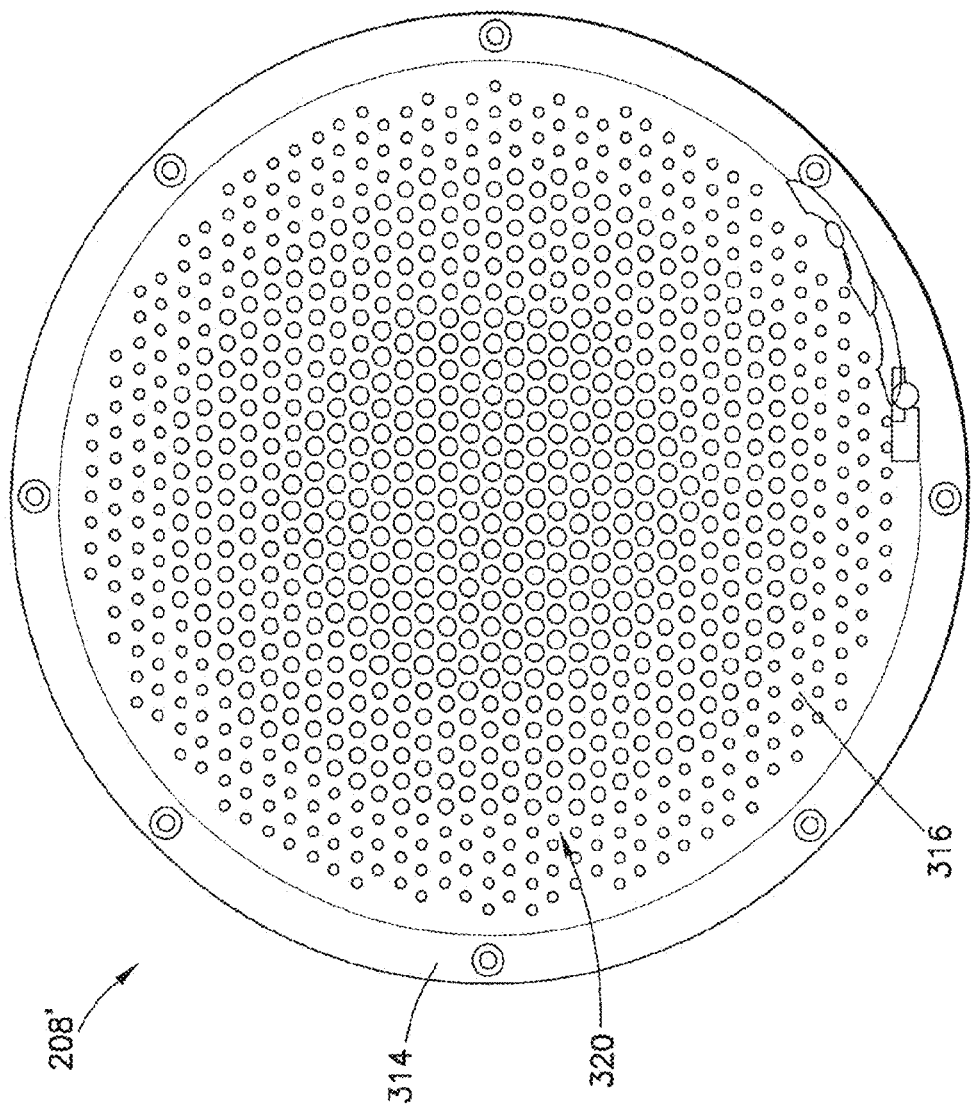

METHOD FOR FLUID PROCESSING A WORKPIECE

CROSS-REFERENCE TO RELATED APPLICATION

This application is a divisional of U.S. Ser. No. 10/971,726 filed on Oct. 22, 2004 which claims the benefits of and priority to U.S. Provisional Patent Application Ser. No. 60/513,761 filed on Oct. 22, 2003, which is owned by the assignee of the instant application and the disclosures of which are incorporated herein by reference in their entireties.

FIELD OF THE INVENTION

The invention relates generally to a method and apparatus for fluid processing a workpiece, and more particularly to a method and apparatus for controlling fluid flow and electric field distribution during the fluid processing of a workpiece.

BACKGROUND OF THE INVENTION

Electrodeposition, among other processes, is used as a manufacturing technique for the application of films e.g., metal films) to various structures and surfaces, such as semiconductor wafers and silicon workpieces. An important feature of systems used for such processes is their ability to produce films with uniform and repeatable characteristics such as film thickness, composition, and profile relative to the underlying workpiece profile.

A number of factors can prevent the formation of a uniform film. For example, the plating current can spread out when passing from the anode to the cathode of the system, which can result in thicker plated deposits near the outer edge of a workpiece. In addition, the fluid distribution in a process chamber, particularly at an anode or cathode surface, may not be uniform. Non-uniform fluid distribution at the cathode can cause a variation in the thickness of the diffusion boundary layer across the workpiece surface, which can lead to non-uniform film thickness. Moreover, inefficient fluid mixing near a surface where a film is being deposited can result in air or gas bubbles becoming entrapped at the surface. This can inhibit further deposition in the vicinity of the gas bubble, which can cause a non-uniform deposition. Finally, if a workpiece is not securely retained in a process chamber, the position of the workpiece can change during processing, and when fluid processing a workpiece, fluid can leak into unwanted areas if a secure, fluid-tight seal is not formed with the workpiece.

Prior art systems suffer from one or more of these limitations, and a need therefore exists for new and improved methods and apparatus for controlling fluid flow and electric field distribution during the fluid processing of a workpiece and for reliably retaining a workpiece during processing.

SUMMARY OF THE INVENTION

The invention, in various aspects, features a system application and removal of materials from one or more surfaces of the workpiece(s). The application and removal can be performed by fluid flow control and/or electric field control at a surface of a workpiece. A workpiece can be planar or substantially planar, and can be thin or ultra-thin. Suitable workpieces include, but not limited to, semiconductor wafers, silicon workpieces, interconnection substrates, and printed circuit boards. This field is sometimes referred to as fluid processing or wet processing, and includes electrodeposition, electroplating, electroless plating, chemical etching, resist coating, resist stripping, dielectric coating, and workpiece cleaning, among other processes.

In one embodiment, the invention, features a method and apparatus for fluid processing a workpiece. The system can include a process module and a system of one or more fluid processing elements to control the fluid flow and/or the electric field distribution during the fluid processing of the workpiece. In various embodiments, a member can be used to agitate the fluid during deposition of a film. The member can employ a non-uniform oscillatory motion to agitate the fluid. The member can be an agitation paddle (e.g., a SHEAR PLATE agitation paddle available from NEXX Systems, Inc. in Billerica, Mass.). In some embodiments, a plate is used to shape an electric field incident on a surface of a workpiece.

By controlling the fluid flow and the electric field distribution, improved deposition of the film on the workpiece surface can result. Furthermore, a vertical configuration and/or a workpiece holder that can retain a plurality of workpieces in a back-to-back configuration can be used to improve throughput and to reduce the footprint of the workpiece processing system. This can increase productivity and reduce cost. In addition, using a modular architecture for the processing system can allow a system layout to be optimized to the fluid process and to the throughput requirements.

In one aspect, the invention features an apparatus for fluid processing a workpiece. The apparatus includes a housing capable of containing a fluid and a workpiece holder disposed within the housing and adapted to retain the workpiece. The apparatus also includes a member disposed within the housing adjacent the workpiece holder and adapted to move substantially parallel to a surface of the workpiece with a non-uniform oscillatory motion to agitate the fluid. In one embodiment, the non-uniform oscillatory motion includes a reversal position that changes after each stoke of the non-uniform oscillatory motion. The non-uniform oscillatory motion can include a primary oscillation stroke and at least one secondary oscillation stroke. The length of the primary oscillation stroke can be substantially the same as the separation of spaced openings defined by the member, and a secondary oscillation stroke can change the reversal position of the non-uniform oscillatory motion of the member.

In one embodiment, the member defines a plurality of spaced openings. In one embodiment, the member includes a plurality of spaced blades. The profile of the plurality of spaced blades can include a cup shape or an angled profile. In some embodiments, the member includes two paddle plates joined by a spacer feature into a single assembly so that the workpiece holder is insertable into the member. In one embodiment, the apparatus also includes a linear motor assembly to move the member.

In one embodiment, the apparatus includes a plate disposed adjacent the member to shape the electric field incident on a surface of the workpiece. A body of the plate can define a plurality of holes, the diameters of which vary (e.g., with a substantially radial pattern) on a surface of the plate. In various embodiments, the member can form a non-periodic fluid boundary layer at the surface of the workpiece. In one embodiment, the member reduces a fluid boundary layer thickness at the surface of the workpiece, e.g., to less than about at 10 μm. The member can be positioned less than about 2 mm from the surface of the workpiece.

FIG. 17 shows a graphical representation of an exemplary non-uniform oscillation profile 288 for agitating a fluid during fluid processing of a workpiece. The exemplary workpiece 30 and center point 252 in FIGS. 15 and 16 are referenced for illustrative purposes. The position of the center point 252 of the member 204x relative to the work-piece point 256 on the surface of the workpiece 30 is plotted versus time. In this embodiment of the member 204x, the separation of the center points 252 is about 20 mm. The primary oscillation stroke is substantially the same as the separation between the center point 252 and an adjacent center point of the member 204x. The secondary oscillation stroke is about 40 mm. Line 292 shows the relative travel of the center point as a result of the primary oscillation stroke. Line 296 shows the relative travel of the center point as a result of the secondary oscillation stroke. As can be seen in FIG. 17, the line 296 extends substantially through the center of each stroke, with a center of each stroke offset with respect to each previous and succeeding stroke, thereby demonstrating the continuous nature of the change of each oscillation (from oscillation to oscillation) and also the change within each oscillation (from one stroke of an oscillation to a next stroke or return stroke of an oscillation) as discussed further below. As may be realized from FIG. 17, the resultant non-uniform oscillation profile is formed by a series of oscillations with each consecutive oscillation in the series being asymmetric. In other words, as shown in FIG. 17, the strokes of one oscillation are offset from each other, and moreover, the strokes of an oscillation are offset from strokes of adjacent oscillations. More particularly, as shown in FIG. 17, an oscillation includes a first stroke 288b and an opposing second stroke or return stroke 288d. Further, the first stroke 288b includes a starting point 288a and an ending point 288c, and the opposing or return second stroke 288d includes a starting point 288c and an ending point 288e. The ending point for the first stroke corresponds to the starting point of the second stroke (or return stroke) and thus also provides a reversing position 288c for the oscillation. As also shown in FIG. 17, the oscillation itself is asymmetrical in that the first stroke 288b is not symmetrical to the second or return stroke 288d about the reversing position 288c as is apparent from the fact that, within one oscillation, the starting point 288a for the first stroke is offset from the ending point for the second stroke 288e. As can also be seen, each of the succeeding reversal points of successive oscillations is offset from that of respective adjacent oscillations.

In yet another aspect, the invention features an apparatus for varying an electric field at a surface of a workpiece. The apparatus includes a housing capable of containing a fluid, a workpiece holder disposed within the housing and adapted to retain the workpiece, and a plate disposed within the housing and spaced from the workpiece. The plate defines a plurality of holes having a distribution of hole sizes to vary a property of the electric field passing through the plate to the surface of the workpiece. In one embodiment, the distribution of hole sizes includes a continuous gradient of hole size (e.g., a substantially radial pattern). In one embodiment, the electric field proximate to the surface of the workpiece is uniform. The property of the electric field can include amplitude. In one embodiment, the plate includes a non-conductive material that serves to block a portion of the electric field as it passes through the plate to the surface of the workpiece.

FIG. 18 shows a graphical representation of another exemplary non-uniform oscillation profile 300 for agitating a fluid during fluid processing of a workpiece. In this embodiment of the member 204x, the separation of the center points 252 is about 20 mm. The primary oscillation stroke is substantially the same as the separation between the center point 252 and an adjacent center point of the member 204x. The first secondary oscillation stroke is about 30 mm. The second secondary oscillation stroke is about 40 mm. The oscillatory motion can include additional secondary oscillation strokes. Line 304 shows the relative travel of the center point as a result of the primary oscillation stroke. Line 308 shows the relative travel of the center point as a result of the first secondary oscillation stroke. Line 312 shows the relative travel of the center point as a result of the second secondary oscillation stroke. As is apparent from FIG. 18, with this profile, not only are there successive changes in reversal positions and starting/end point positions of the oscillations, but also, a plurality of oscillations form successive cycles of oscillations, with each successive cycle having a maximum 300a, 300b, 300c, 300d, 300e. As can be seen in FIG. 18, for each maximum, immediately preceding and succeeding reversal positions are lower than the maximum, thereby demarcating the maximum of a given cycle. As also shown in FIG. 18, the maximum reversal positions for each cycle are also offset with respect to each other, with the maximum reversal position 300a offset from the maximum reversal position 300b of an adjacent cycle of plural oscillations. The maximum 300b is, in turn, offset from the maximum reversal position 300c of the next cycle of plural oscillations, with successive cycles having respective maximum reversal positions 300d, 300e which are offset from the maximum reversal position of an adjacent cycle. Thus, the arrangement of FIG. 18 provides a further modification in that, in addition to having strokes of an oscillation and adjacent oscillations being offset (as in FIG. 17), a plurality of oscillations form a cycle, with one cycle of oscillations differing from an adjacent cycle of oscillations as is apparent from their maximum reversal positions being offset from one another.

In still another aspect, the invention features a method for varying an electric field at a surface of a workpiece. The method includes disposing a workpiece holder within a housing capable of containing a fluid and positioning a plate within the housing spaced from the workpiece holder. The workpiece holder retains workpiece, and the plate defines a plurality of holes having a distribution of hole sizes. The method also includes passing the electric field through uric plate to vary a property of the electric field incident on the surface of the workpiece.

In various embodiments, the method can include minimizing electric field imaging and/or fluid flow imaging of the member on the surface of the workpiece via a non-uniform oscillatory motion. In one embodiment, the method includes removing gas bubbles entrapped in the fluid from the surface of the workpiece. In various embodiments, the method an include depositing or dissoluting a metal or a plastic on a surface of the workpiece. In one embodiment, the method includes forming a non-periodic fluid boundary layer at the surface of the workpiece via the non-uniform oscillatory motion of the member. In one embodiment, the method includes decreasing a fluid boundary layer thickness at the surface of the workpiece via the non-uniform oscillatory motion of the member.

In another aspect, the invention provides an apparatus for fluid processing a workpiece. The apparatus includes a housing capable of containing a fluid, a workpiece holder disposed within the housing and adapted to retain the workpiece, and a member defining a plurality of spaced openings. The member can be disposed within the housing adjacent the workpiece holder and can be adapted to move substantially parallel to a surface of the workpiece so that the plurality of spaced openings can agitate the fluid. In one embodiment, a non-uniform oscillatory motion of the plurality of spaced openings agitates the fluid. The non-uniform oscillatory motion, can include a reversal position that changes after each stoke of the non-uniform oscillatory motion. In one embodiment, the non-uniform oscillatory motion includes a primary oscillation stroke and at least one secondary oscillation stroke. The length of the primary oscillation stroke can be substantially the same as the separation of spaced openings defined by the member, and a secondary oscillation stroke can change the reversal position of the non-uniform oscillatory motion of the member. In one embodiment, a linear motor assembly moves the member.

In one embodiment, the apparatus also includes plate disposed adjacent the member to shape the electric field incident on a surface of the workpiece. A body of the plate can define a plurality of holes, diameters of which varying on a surface of the plate. The plurality of holes can vary in a substantially radial pattern. The member can form a non-periodic fluid boundary layer at the surface of the workpiece. In one embodiment, the member reduces a fluid boundary layer thickness at the surface of the workpiece, e.g., to less than about at 10 µm. In one embodiment, the member is positioned less than about 2 mm from the surface of the workpiece.

In still another aspect, the invention features a method of fluid processing a workpiece. The method includes disposing a workpiece holder within a housing capable of containing a fluid and positioning a member within the housing adjacent the workpiece holder. The workpiece holder retains the workpiece, and the member defines a plurality of spaced openings. The method also includes agitating the fluid with the plurality of spaced openings by moving the member substantially parallel a surface of the workpiece.

In various embodiments, the method can include minimizing electric field imaging and/or fluid flow imaging of the member on the surface of the workpiece via a non-uniform oscillatory motion. In one embodiment, the method includes removing gas bubbles entrapped in the fluid from the surface of the workpiece. In various embodiments, the method can include depositing or dissoluting a metal or a plastic on a surface of the workpiece.

In another aspect, the invention features an apparatus for fluid processing a workpiece. The apparatus includes a mean for retaining the workpiece in a housing capable of containing a fluid, and a means for agitating the fluid with a non-uniform oscillatory motion substantially parallel, to a surface of the workpiece.

In yet another aspect, the invention provides an apparatus for varying an electric field at a surface of a workpiece. The apparatus includes a mean for retaining the workpiece in a housing capable of containing a fluid, and a means defining a plurality of holes having distribution of hole sizes for varying the electric field incident on the surface of the workpiece.

In still another aspect, the invention features an apparatus for fluid processing a workpiece. The apparatus includes a mean for retaining the workpiece in a housing capable of containing a fluid, and a means defining a plurality of spaced openings for agitating the fluid with a motion substantially parallel to a surface of the workpiece.

Other aspects and advantages of the invention will become apparent from the following drawings, detailed description, and claims, all of which illustrate principles of the invention, by way of example only.

BRIEF DESCRIPTION OF THE DRAWINGS

The advantages of the invention described above, together with further advantages, may be better understood by referring to the following description taken in conjunction with the accompanying drawings. In drawings, like reference characters generally refer to the same parts throughout the different views. The drawings are not necessarily to scale, emphasis instead generally being placed upon illustrating the principles of the invention.

FIGS. 8A-8C depict diagrammatic representations of the movement and action of the member and the flex feature(s) of an apparatus for retaining a workpiece according to the invention.

FIG. 20 depicts a plan view of an exemplary embodiment of a plate for varying an electric field during processing of a workpiece according to the invention.

DESCRIPTION OF THE INVENTION

Figure 1:
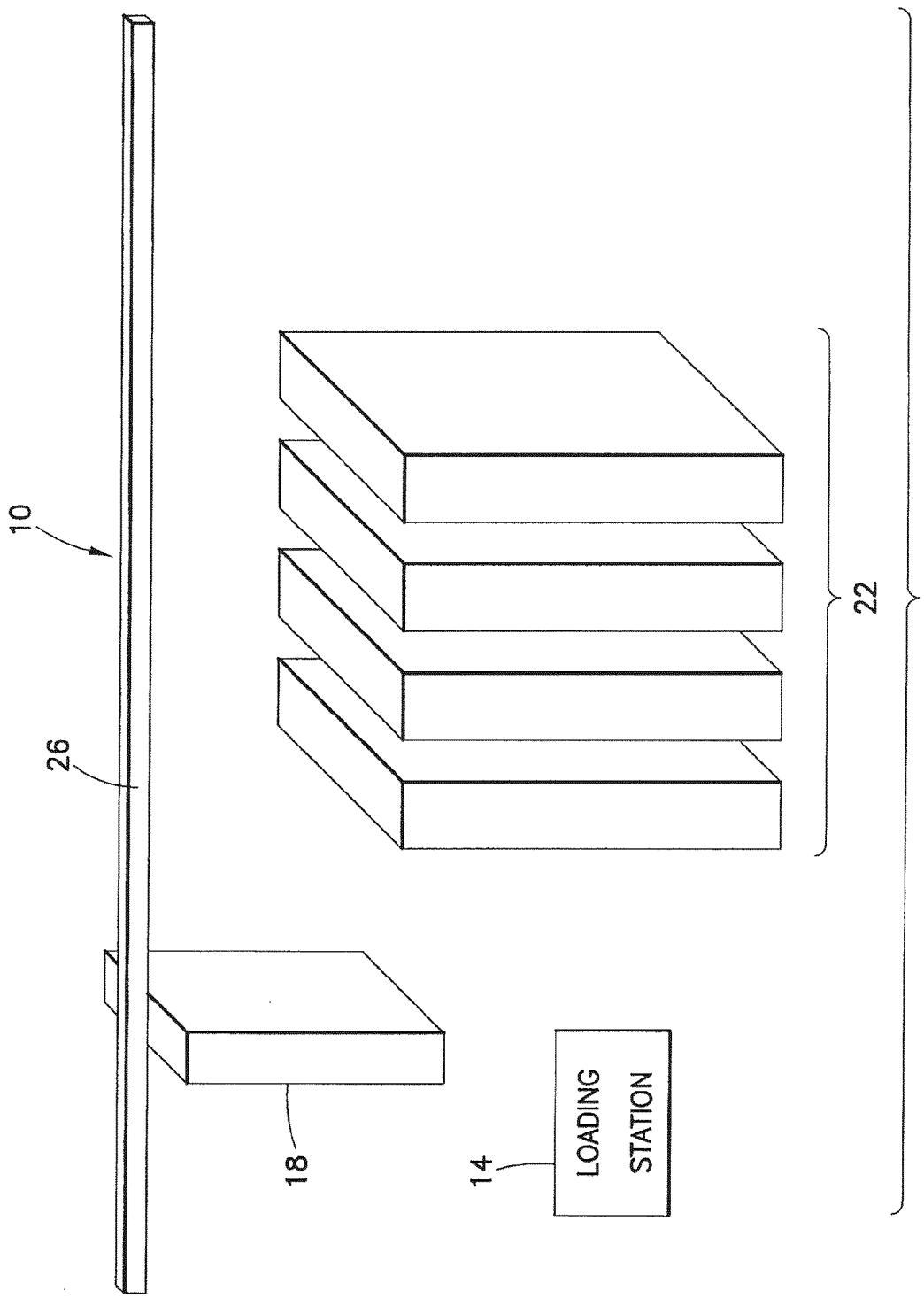
FIG. 1 depicts a block diagram of an exemplary production system for a workpiece.

FIG. 1 illustrates an exemplary production system 10 for a workpiece. The production system 10 can utilize various features of the invention. The production system 10 can include a loading station 14 for delivering a workpiece to a workpiece holder 18. The production system 10 can also include one or more modules 22, e.g., process modules, for processing a workplace. The loading station 14 and the one or more modules 22 can be mounted in a single framework, or in adjacent frameworks. The framework can include a transport system 26 for moving a workpiece holder 18 from the loading station 14 to a first module and between modules. An exemplary production system is a Stratus System available from NEXX Systems, Inc. in Billerica, Mass.

The workpiece (examples of which are shown in subsequent figures) can be planar, substantially planar, and/or thin or ultra-thin. In various embodiments, the workpiece has a circular shape or a substantially circular shape. In other embodiments, the workpiece is non-circular. For example, the workpiece can be rectangular, square, oval, or triangular, or have another suitable geometric configuration. In various embodiments, the workpiece can be, for example, a semiconductor wafer, silicon workpiece, interconnection substrate, printed circuit board, or other workpiece suitable for processing. The loading station 14 can be an automated loading station, such as an automated wafer handling front end available from Newport Automation in Irvine, Calif. or Brooks Automation in Chelmsford, Mass.

The workpiece holder 18, according to the invention, can be used to retain a single workpiece, or a plurality of workpieces. The workpiece holder 18 can utilize a back-to-back configuration for two or more workpieces. Furthermore, the workpiece holder 18 can have a hole bored through its center for processing a plurality of surfaces of a single workpiece. These embodiments are described in more detail below.

Each of the one or more modules 22, according to the invention, can be used for cleaning, rinsing, drying, pretreating, plating, buffering/holding, etching, electrodepositing, electroplating, electroetching, electrodissolution, electroless depositing, electroless dissolution, photoresist depositing, photoresist stripping, chemical etch processing, seed layer etching, and similar processes requiring fluid flow and/or electric field control and use. In various embodiments, the workpiece is retained by the workpiece holder 18 while processing is performed. Each of the one or more modules 22 and/or the workpiece holder 18 can be used to apply a variety of films to a surface of a workpiece, including, but not limited to, metal, plastic, and polymer films. Suitable metals include, but are not limited to, copper, gold, lead, tin, nickel, and iron. In addition, alloys, compounds, and solders of these metals (e.g., lead/tin and nickel/iron) can be applied to a workpiece surface.

In various embodiments, the film deposited can have a thickness between about 1 μm and about 150 μm. Using the features of the invention, the film can be high purity, and the thickness can be uniform across the surface of the workpiece. The film can have uniform electrical properties on (i) a flat, continuous uniform surface, (ii) on a flat continuous surface micro-scale topography, and/or (iii) on a flat surface with topography and/or photo-resist patterning.

In various embodiments, the production system 10 can include between one and thirty modules, although additional modules can be used depending on the application. Various novel features of the one or more modules 22 are described in more detail below. Each of the one or more modules 22 can include a robust and modular construction so that it can be removed from the production system 10. As such, the production system 10 can be customizable for specific applications. For example, a module and a workpiece holder can be configurable for processing different sized workpieces, e.g., 150, 200, 250 or 300 mm wafers, with minimal lost production time during customization.

In addition, the layout of a processing system, e.g., the position or sequence of one or more process modules, can be optimized for a specific fluid process or for a series of processes, which can lead to increased throughput. For example, a vertical line architecture, e.g., as utilized by the Stratus system, can be combined with a dual wafer processing system. Deposition modules can be about 20 cm wide, and the number of modules can be adjusted to match the rate of the loading station. An exemplary rate is about 40 workpieces per hour.

Furthermore, the layout of a processing system can orient a workpiece in a vertical configuration. For a process or series of processes having a long deposition time, a vertical configuration can enable a significant number of workpieces to be processed simultaneously. For example, for a process time longer than about 10 minutes, over 20 workpieces can be processed simultaneously. In addition, in a process that generates substantial volumes of gas or air at the workpiece surface, electrophoretic deposition of photoresist, a vertical configuration can facilitate the removal of air or gas bubbles from the surface of a workpiece.

The production system 10 itself can be manual or automated. The production system 10 can include a computer that controls the operation of the loading station 14 and/or the transport system 26, as well the one or more modules 22. In one exemplary embodiment of an automated system, a freshly loaded workpiece is transported from the loading station 14 to the most distant module, and then subsequent processing returns the finished workpiece to the loading station 14.

Figure 2:
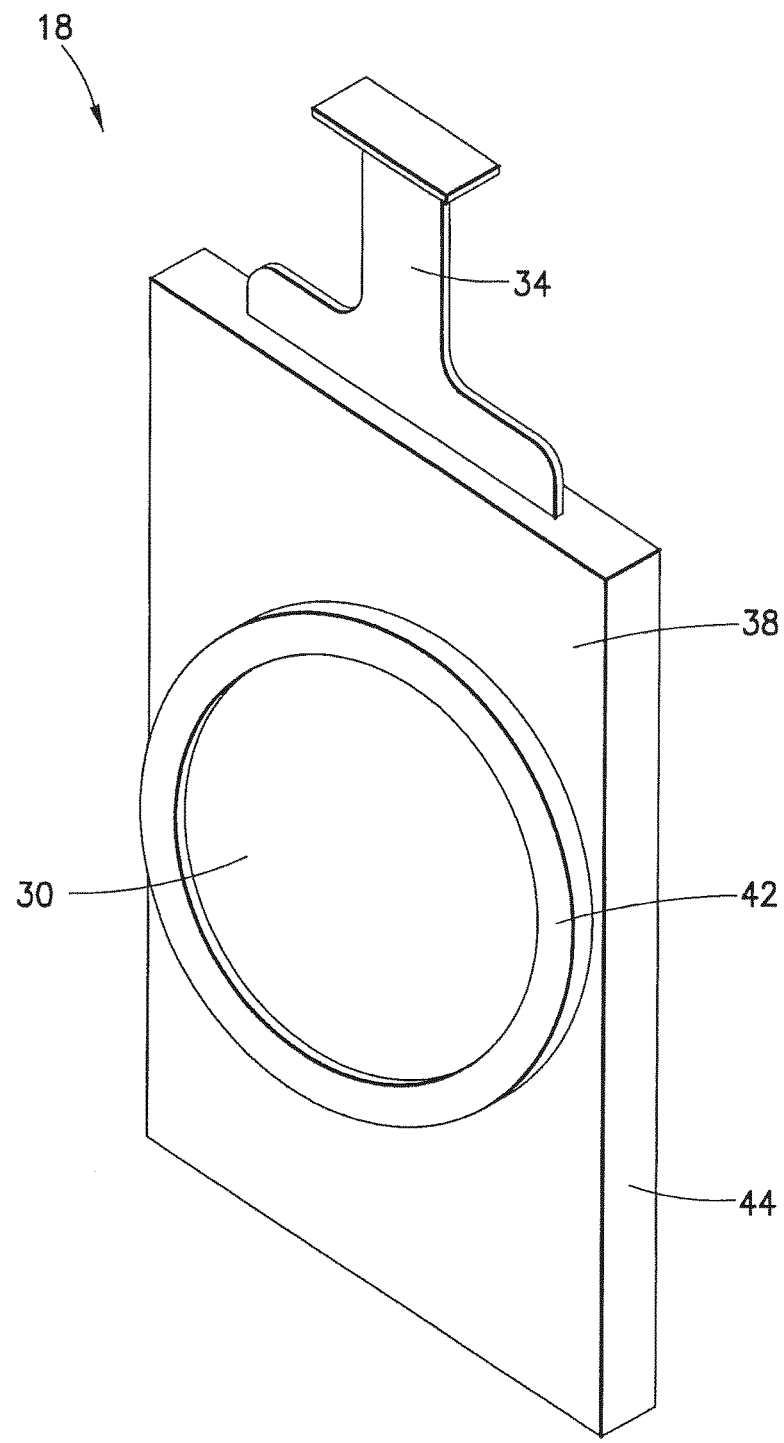
FIG. 2 shows a perspective view of an illustrative embodiment of a workpiece holder according to the invention.

FIG. 2 shows an illustrative embodiment of workpiece holder 13 for retaining a workpiece 30. In this illustrative embodiment, the workpiece holder 18 includes a handle 34 that can be used to lift and/or transport the workpiece holder 18. The handle can be engageable with the transport mechanism 26 shown in FIG. 1. The workpiece holder 16 also includes a body 38 and a ring 42 for contacting the workpiece 30. In various embodiments, the body 38 of the workpiece holder 18 is formed from a plastic, such as high density polyethylene (HDPE) or polyvinylidene fluoride (PVDF). The body 38 can also include a guide strip (shown in FIGS. 5 and 6) formed in at least one edge 44. The guide strip(s) can be used to align the workpiece holder 13 in one of the modules 22.

The ring 42 can press, hold, and/or retain the workpiece 30 against, the body 38 of the workpiece holder. Contact between the workpiece 30 and the ring 42 occurs at the outer perimeter of the workpiece 30, e.g., by contacting less than 2 mm of the outer perimeter of the workpiece 30. In various embodiments, the ring 42 includes a flexible member encased in an elastomer. Portion(s) of the elastomer can be used to contact the workpiece 30, and, in some embodiments, can create a seal with the workpiece 30.

In various embodiments, the ring 42 can have a circular shape, a substantially circular shape, or be non-circular (e.g., rectangular, square, oval, or triangular, or have another suitable geometric configuration). In one embodiment, the ring 42 has a low profile relative to the workpiece 30. For example, in one detailed embodiment, the ring 42 extends less than about 1 mm beyond the plane of the exposed surface of the workpiece 30. In various embodiments, the ring 42 can be a contact ring or a sealing ring. In one embodiment, the ring 42 is the sealing ring assembly described in U.S. Pat. No. 6,540,899 to Keigler, the entire disclosure of which is herein incorporated by reference.

Figure 3:
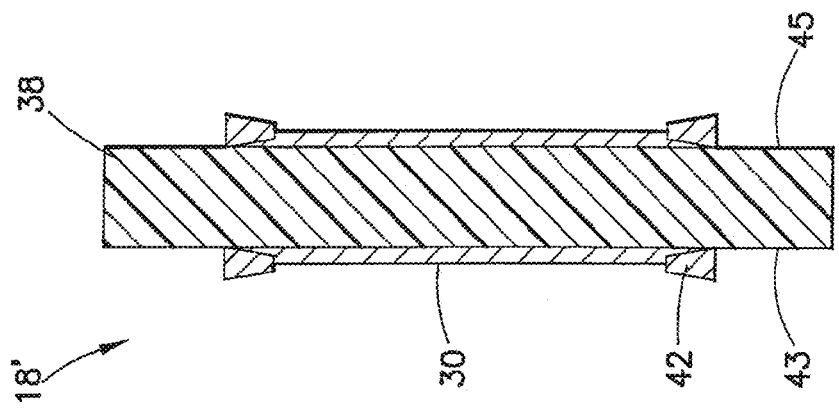
FIG. 3 shows a cross-section of an exemplary workpiece holder for retaining a plurality of workpieces according to the invention.

FIG. 3 depicts a cross-section of an illustrative embodiment of a workpiece holder 18 that can be used to retain a plurality of workpieces 30. The body 38 of the workpiece holder 18' includes a first surface 43 in a first plane and a second surface 45 in a second plane (e.g., a front surface and a back surface). Each surface has associated with it a ring 42 for retaining a respective workpiece 30, e.g., for retaining the respective workpiece 30 against the respective surface 43 or 45 of the workpiece holder 18'. For example, a first ring can retain a first workpiece on the first surface of the workpiece holder in the first plane, and a second ring can retain a second workpiece on the second surface of the workpiece holder in a second plane.

According to the embodiment illustrated in FIG. 3, the first and second planes are parallel to each other and spaced apart. In various embodiments, the first and second planes form an angle. In one embodiment, the first and second planes are orthogonal. In other embodiments, the first and second planes form either an acute angle or an obtuse angle. It is understood that the invention is not limited to a workpiece holder with only two planes. Embodiments using a single plane or more than two planes can be used. Two planes axe used here to illustrate, an exemplary embodiment of an apparatus retaining a plurality of workpieces.

In one embodiment, the workpieces are held in a back-to-back configuration, and, in a detailed embodiment, the workpieces are centered on each other in the back-to-back configuration. In some embodiments, the workpieces are held on distinct, surfaces of the workpiece holder and are offset from one another. In another embodiment, a plurality of workpieces can be held on a single surface of a workpiece holder, e.g., in a side-by-side configuration. In some embodiments, a plurality of workpieces can be held on one surface of a workpiece holder, while at least one additional workpiece is held on a second surface of a workpiece holder.

Figure 4:
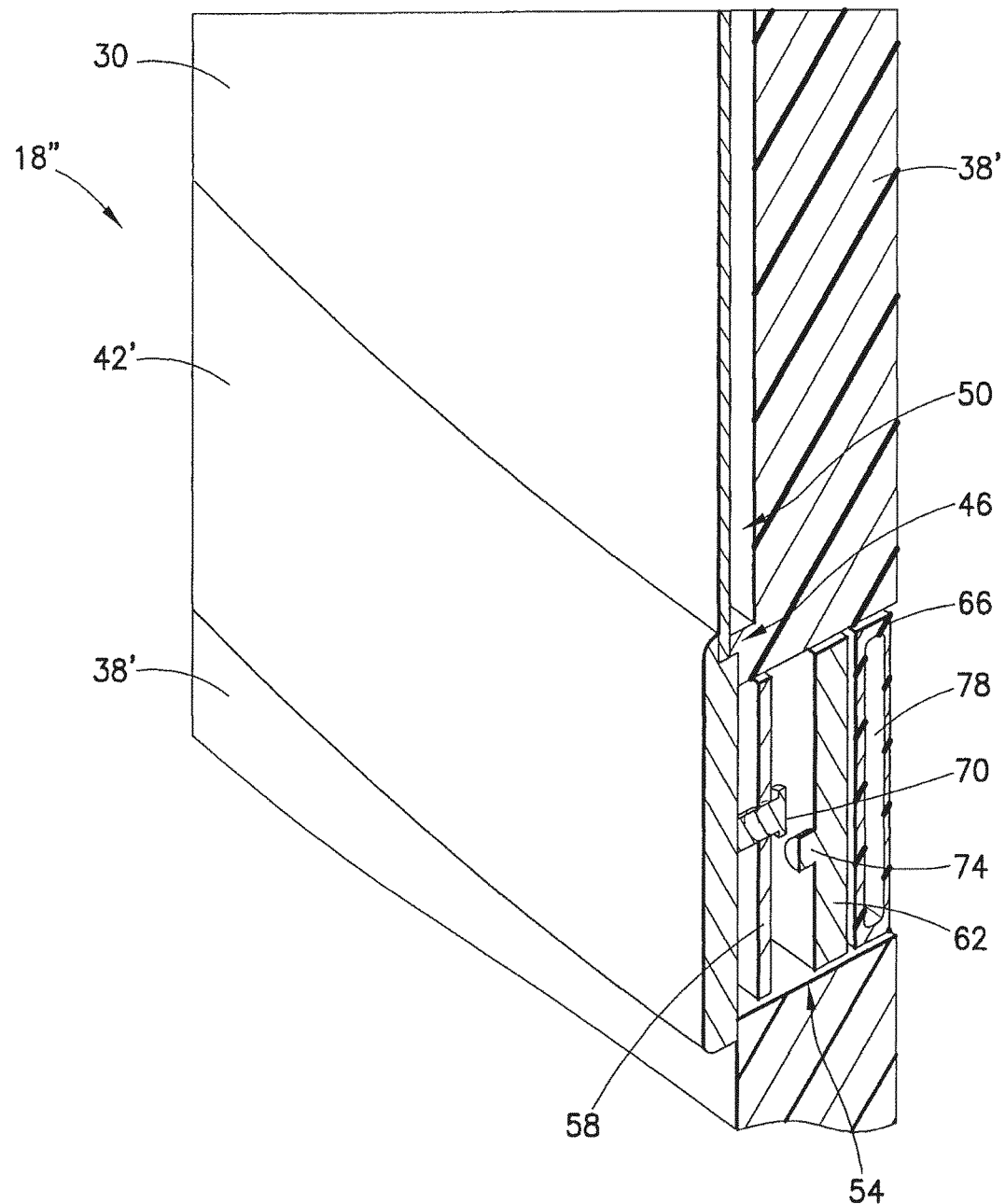
FIG. 4 shows a cross-section of exemplary workpiece holder according to the invention.

FIG. 4 illustrates a cross-section of another embodiment of a workpiece holder 18, which an exemplary system for retaining the workpiece 30 against the workpiece holder 18. A ring 42 holds the workpiece 30 against a body 38' of the workpiece holder 18". The workpiece 30 contacts the body 38 at a contact point 46. The body 38 can define a recess 50 so that the workpiece 30 only contacts a portion of the body 38'.

Figure 5:
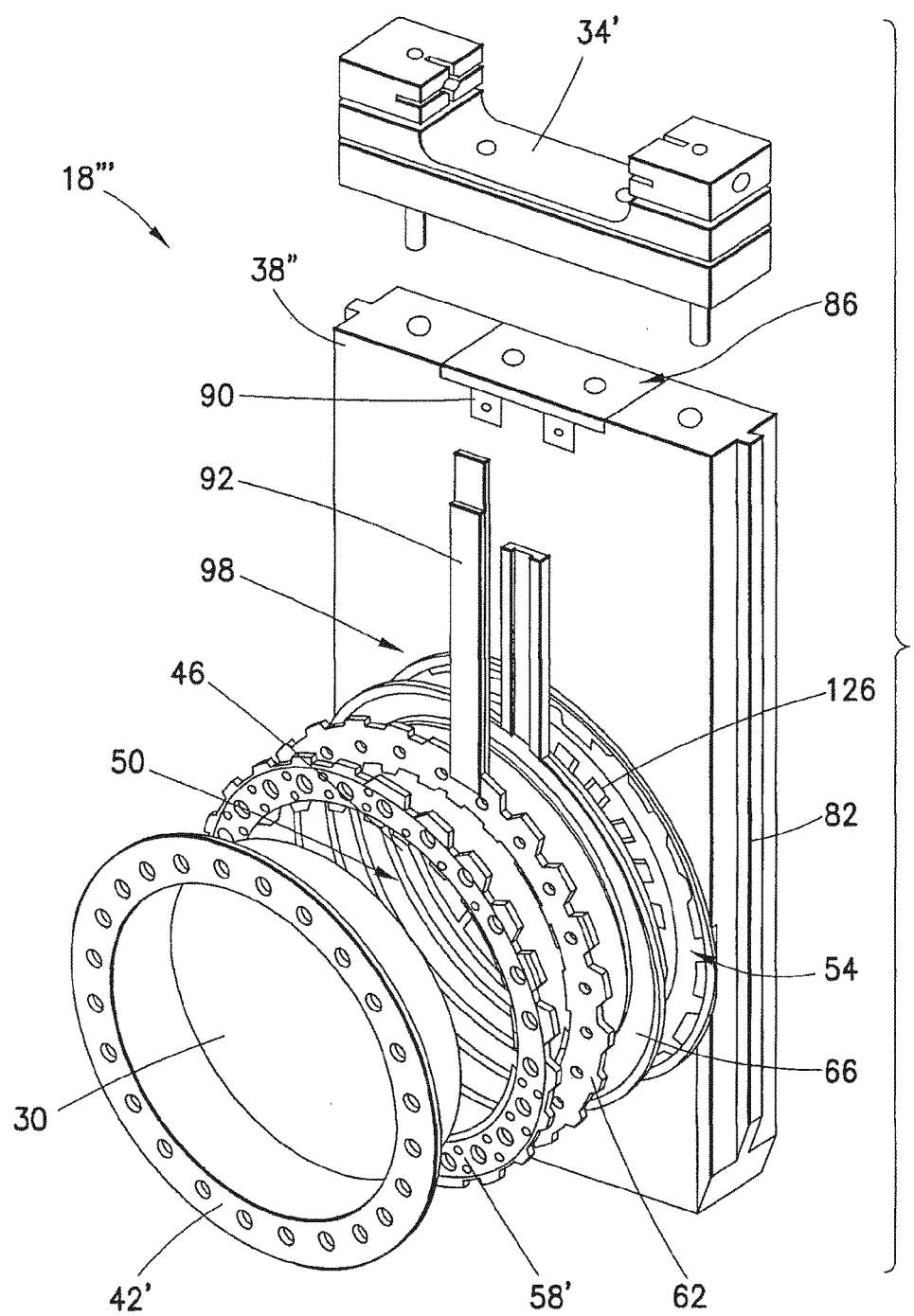
FIG. 5 depicts an exploded view of another exemplary workpiece holder according to the invention.
Figure 6:
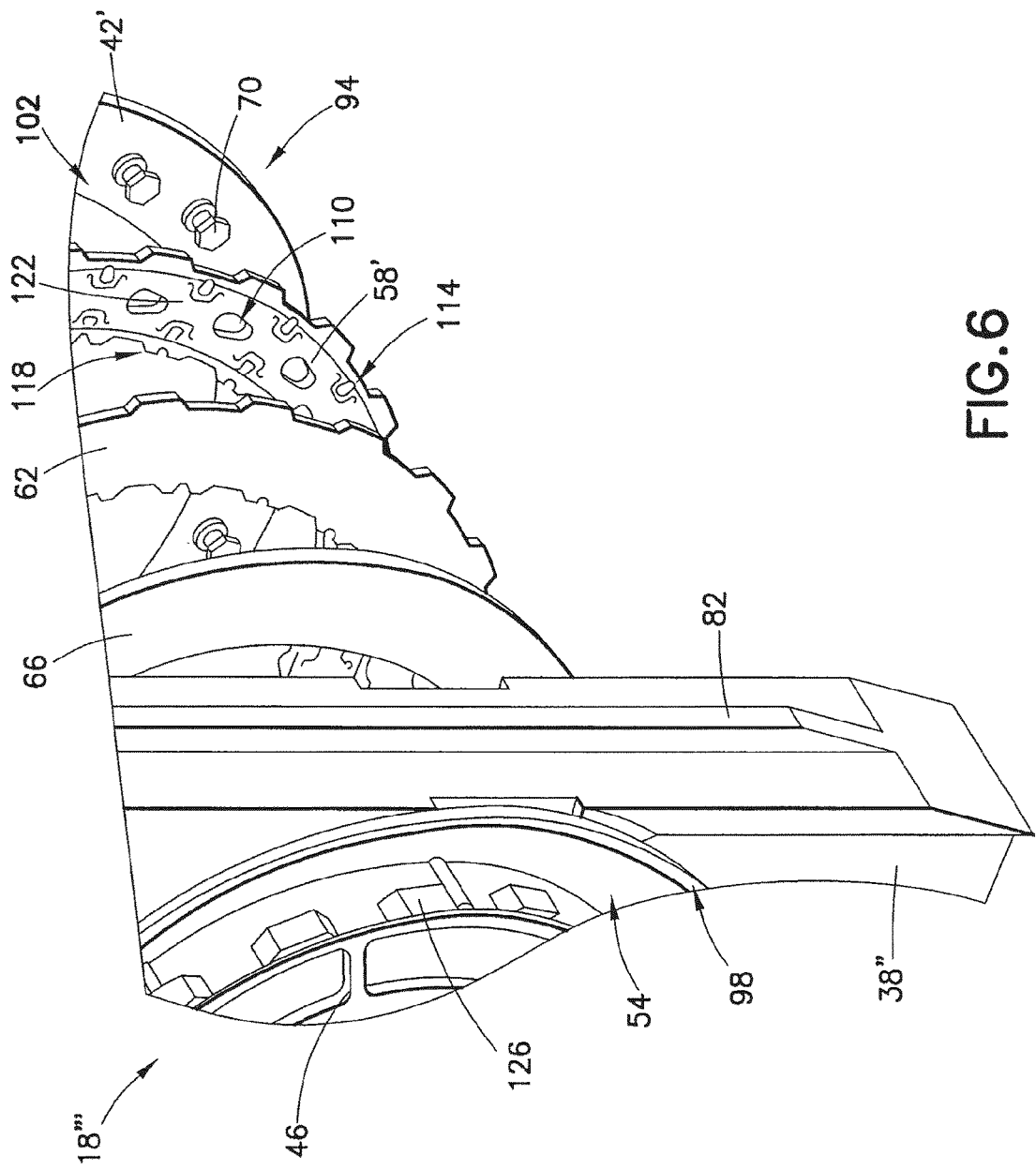
FIG. 6 shows another exploded view the workpiece holder of FIG. 5.

According to the illustrated embodiment, the body of the workpiece holder 18" defines a groove 54 for holding at least a member 58, a backing member 62, and a bladder 66. The member 58 is flexible, and can also be referred to as a flexure plate. The member 58 can have a circular shape, a substantially circular shape, or be non-circular (e.g., rectangular, square, oval, or triangular, or have another suitable geometric configuration). In some embodiments, the member 58 can be a ring or a plate, and in one detailed embodiment, can have a substantially planar ring-shape. In various embodiments, the member 58 can be formed from a spring-like material, such as stainless steel or titanium. The member 58 can include at least one retaining feature (e.g., as shown in FIGS. 5 and 6) that can engage at least one engagement feature of the ring, for example, engagement feature 70 of the ring 42. In various embodiments, the ring 42 and the member 58 are removably attached to the workpiece holder 18".

The backing member 62 can be a plate or a push plate, and can include at least one push pin 74. In various embodiments, the backing member 62 can have a circular shape, a substantially circular shape, or be non-circular. In various embodiments, the backing member 62 can be a ring or a plate. The backing member 62 can be formed from a metal, a plastic, or a polymer material. The bladder 66, which can be a pneumatic bladder, defines a cavity 78 that can be filled with a fluid, such as air, to inflate the bladder 66. When inflated, the bladder 66 pushes against the backing member 62 causing the at least one push in 74 to contact the member 58, which causes the member to flex. The bladder 66 can have a circular shape, a substantially circular shape, or be non-circular, and, in various embodiments, can be a ring or a plate. In various embodiments, the bladder 66 can be formed from a fluoroelastomer, urethane, or mylar material.

FIGS. 5 and 6 show exploded views of another exemplary workpiece holder 18''' for retaining the workpiece 30. FIG. 5 shows the view from a first perspective, and FIG. 6 shows the view from a second perspective. This embodiment of the workpiece holder 18'' includes the ring 42', the groove 54, the backing member 62, and the bladder 66. The workplace holder 18 can also include a handle 34 and a member 58'.

The workpiece holder 18''' shown in FIGS. 5 and 6 also includes a body 38'', which can include a guide strip 82. In one embodiment, the recess 50 defined in the body 38'' includes multiple contact points 46 for providing support to the workpiece 30. In the illustrated embodiment, the body 38'' includes at least one port 86 for providing a fluid to the bladder 66 and/or vacuum to the underside of the ring 42' via ducts (not shown) in the body 38''. In various embodiments, the body 38'' can also include at least one electrical contact 90 to communicate electrical current to the workpiece 30. The backing member 62 can be connected to a stud 92 that is engageable with the body 38''. The stud 92 provides a force to contact the backing member 62 to the member 58'.

The ring 42' illustrated in FIG. 6 includes at least one engagement feature 70, which, in one embodiment, is formed as one or more studs. A sealing groove 94 can circumscribe the outer perimeter of the ring 42'. The sealing groove 94, which can be an elastomer region of the ring 42', can mate with a sealing boss 98 that can circumscribe a perimeter of the workpiece holder 18'''. In one embodiment, this mating forms a barrier to fluid entry, e.g., a fluid-tight seal, between the workpiece holder 18''' and the ring 42'.

In various embodiments, the ring 42' also includes an inner sealing surface 102 that can form a barrier to fluid entry with the workpiece 30. The inner sealing surface 102 can form an electrical connection with the workpiece 30 as well. For example, the inner sealing surface 102 can include flexure fingers that contact the workpiece 30. The flexure fingers can include exposed terminal tips for making electrical contact. The electrical current path can carrying up to 75 amps of electrical current to the workpiece surface and can allow for independent electrical current control to a plurality of workpieces.

In various embodiments, the inner sealing surface 102 can include an elastomer region that is deflected under sufficient force to form a barrier to fluid entry.

In some embodiments, the member 58 defines at least one retaining feature 110 and at least one flex feature 114. The member 58 can include at least one tab section 118. The features of the member 58 can be cut, e.g., laser cut, into the member 58'. The at least one retaining feature 110 can be engageable with the at least one engagement feature 70 of the ring 42'. In various embodiments, the at least one retaining feature 110 can be a keyhole slot or a capture slot out into the member 58'. In one embodiment, the at least one flex feature 114 has a ram's head shape.

In one embodiment, the member 58' defines a plurality of flex features 114. In combination, the plurality of the flex features 114 can provide an effective long path around the main body 122 of the member 58' to allow for substantial flexing of the member 58'. In one embodiment, the plurality of flex features 114 can provide a force at least substantially uniformly around the perimeter of an object, e.g., a workpiece 30, when the member is flexed. The force can be provided substantially normal to the plane of the member 58'. When the force is applied, the ring 42' can retain the object. The flex feature(s) 114, in this embodiment or in other embodiments, can be formed about a perimeter of the member 58', e.g., an inner perimeter, an outer perimeter, or on both the inner and outer perimeters.

In some embodiments, the groove 54, e.g., a ring shaped cavity defined in the body 38''', can include at least one tooth feature 126 that can engage at least one tab section 118 of the member 58'. When a plurality of tab sections 118 are flexed away from the main body 122, a force arises between the tab sections 118 perpendicular to the plane of the workpiece 30.

Referring to FIGS. 5 and 6, the ring 42' and the member 58' can be removably attached to the workpiece holder 18'''. In one embodiment, one or more engagement features 70 of the ring 42' can be engaged by (e.g., inserted or attached) one or more retaining features 110 of the member 58'. In an embodiment using keyhole slots, for example, the ring 42' can be rotated by several degrees until the engagement feature(s) 70 stop against narrower end of the retaining feature(s) 110. This causes the shoulder of the engagement feature(s) 70 to lie behind the member 58'. The bladder 66 can then be partially or entirely deflated. Flexure force formed by the flex features 114 causes the member 58' to deflect and pull against the one or more engagement features 70. In this embodiment, this pulls the ring 42' toward the workpiece holder 18'''.

In one embodiment, flexing a member provides a force to at least one engagement feature to cause a ring to form a barrier to fluid entry with a workpiece. For example, the force can cause the member 58' to pull the at least one engagement feature 70 of the ring 42' to cause it to push against the workpiece 30 to form the barrier to fluid entry. The at least one flex feature 114 can be adapted to provide the force substantially normal to the plane of the member 58' to form the barrier. The flex feature 114 can be positioned about a perimeter of the member 58' to provide the force at least substantially uniformly from the perimeter (e.g., an inner perimeter, an outer perimeter, or as shown in FIGS. 5 and 6, both the inner and outer perimeters.) The force deforming the member 58' can be about one kilogram per linear centimeter of the ring's 42' perimeter.

To remove a first workpiece from the workpiece holder or to exchange a first and second workpiece, the force between the member 58' and the ring 42' can be removed by inflating the bladder 66 so that the backing member 62 contacts the member 58' (with or without push pins 74) to deform it. The force engaging the engagement feature(s) 70 is relaxed so that they can be disengaged from the retaining feature(s) 110. In one embodiment, the force engaging the engagement feature (s) 70 is relaxed so that the ring 42' can be rotated and moved away from the workpiece holder 18'''. The first workpiece can be removed from the ring 42', and if desired, a fresh workpiece can be disposed on the ring 42'.

In one embodiment, the fluid seal can hold the workpiece with sufficient force to prohibit fluid intrusion even when all power to the processing system is lost due to an unforeseen event. In one embodiment, the barrier to fluid entry can tested after a workpiece loading procedure and/or prior to processing a workpiece to ensure a workpiece has been properly loaded. For example, a small vacuum, e.g., about minus 0.05 atm, is applied to the cavity of the workpiece holder 18'''. The vacuum can be applied, for example, to the recess 50. The path to the vacuum can then be closed off, and the leak-up rate of the vacuum can be measured. If the vacuum in the workpiece holder 18''' does not change by more than a prescribed amount over a defined time period, then the integrity of the barrier is considered to be verified (e.g., about 10 percent in less than about 5 seconds). If the vacuum changes at a faster rate, the ring 42' may not be mounted properly, and the workpiece can be unloaded and reloaded.

Figure 7:
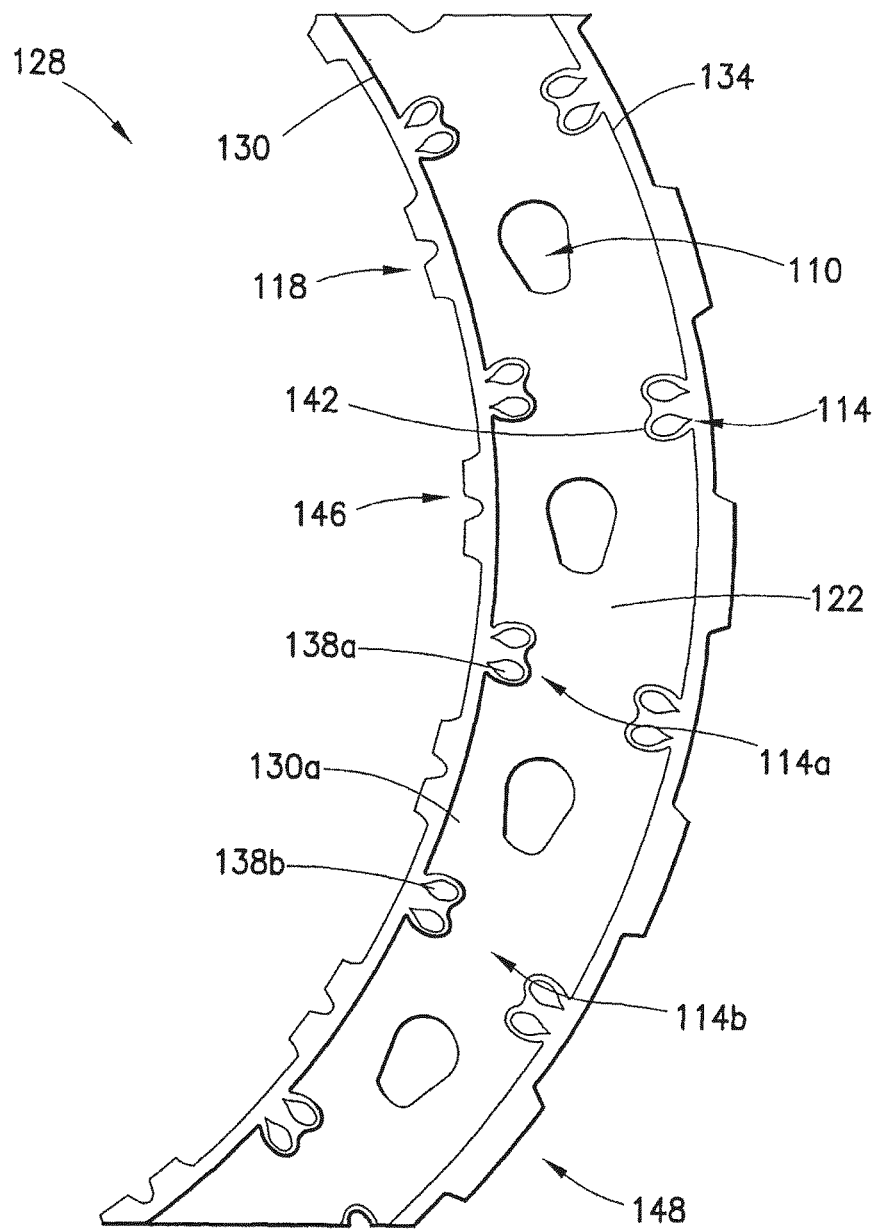
FIG. 7 snows a plan view of a portion of an exemplary member having a plurality of flex features according to the invention.

FIG. 7 shows a detailed, view of a portion 128 of the member 58', including retaining features 110, flex features 114, and tab sections 118. As illustrated, the member 58' defines lines 130 and 134 extending about the inner and outer perimeters of the member 58', respectively. The lines 130 and 134 are cut at least substantially through the main body 122. In one detailed embodiment, the lines 130 and 134 are cut through the main body 122. The lines do not extend continuously about the perimeters. Instead, the lines 130 and 134 are series of distinct lines. For example, line 130a extends from a first retaining features 114a to an adjacent flex features 114b. The line 130a terminates in the two tear-drop shaped regions 138a and 138b defined in the flex features 114a and 114b, respectively. According to the illustrated embodiment, the flex feature 114, 114a or 114b also includes an Ω-shaped line 142. In one embodiment, two proximate tear-drop shaped regions and an Ω-shaped line combine to form an individual flex feature. The flex feature can have a ram's head shape.

In one embodiment, using a series of distinct lines can provide a substantially long path around a perimeter of the member along which the member can be flexed. Furthermore, using a series of distinct lines can promote an at least substantially uniform force from the perimeter.

In various embodiments, the tab sections 118 include a notch 146. In one embodiment, the notch 146 interfaces with a corresponding catch in a groove 54 of the workpiece holder. The notch 146 can prevent the member 58 from rotating. The member 58' can include outer tab sections 148, which can be used to retain the member 58' in the workpiece holder.

The movement of the member 58 or 58' and the action of the flex feature(s) 114 can be shown diagrammatically. For illustrative purposes and without being bound to theory, FIGS. 8A-8C show diagrammatic representations.

FIG. 8A shows the member 58 or in a relaxed state. Plate 150 and springs 154 represent the member 58 or 58'. The flex feature(s) 114 can act like springs 154 to apply force. Anchor points 138 represent restraining features of a workpiece holder. For example, the anchor points 138 can be the tooth feature(s) 126 formed in the groove 54 of the workpiece holder. The anchor points 138 can restrain the tabs sections 118 of the member 53 or 58'.

FIG. 8B shows a portion of the ring 42 or 42', including the engagement feature 70 (shown as a stud in FIGS. 8B and 8C). A force 162 is applied to the plate 150 (i.e., the member 58 or 58') to flex the member 58 or 58' into an overextended state. When overextended, engagement between the ring 42 or 42 and the member 58 or 58' can be made (e.g., in one embodiment, the retaining feature captures the engagement feature). In a detailed embodiment, engagement occurs between the engagement feature 70 and the retaining feature 110. In one embodiment, the force 162 is applied by the backing member 62. The springs 154 the flex features 114) exert a force 166 in substantially the opposite direction as the force 162.

FIG. 8C depicts the apparatus in a state where the member 58 or 58' is applying the force 166 to the engagement feature 70 via its retaining feature 110. The springs 154 exert the force 166 substantially normal to the plane of the member 58 or 58'. In one embodiment, the force 166 causes the member 58 or 58' to pull the engagement feature 70, which causes the ring 42 or 42' to contact the workpiece 30. This contact can form a barrier to fluid entry between the workpiece 30 and the ring 42 or 42'.

Figure 9:
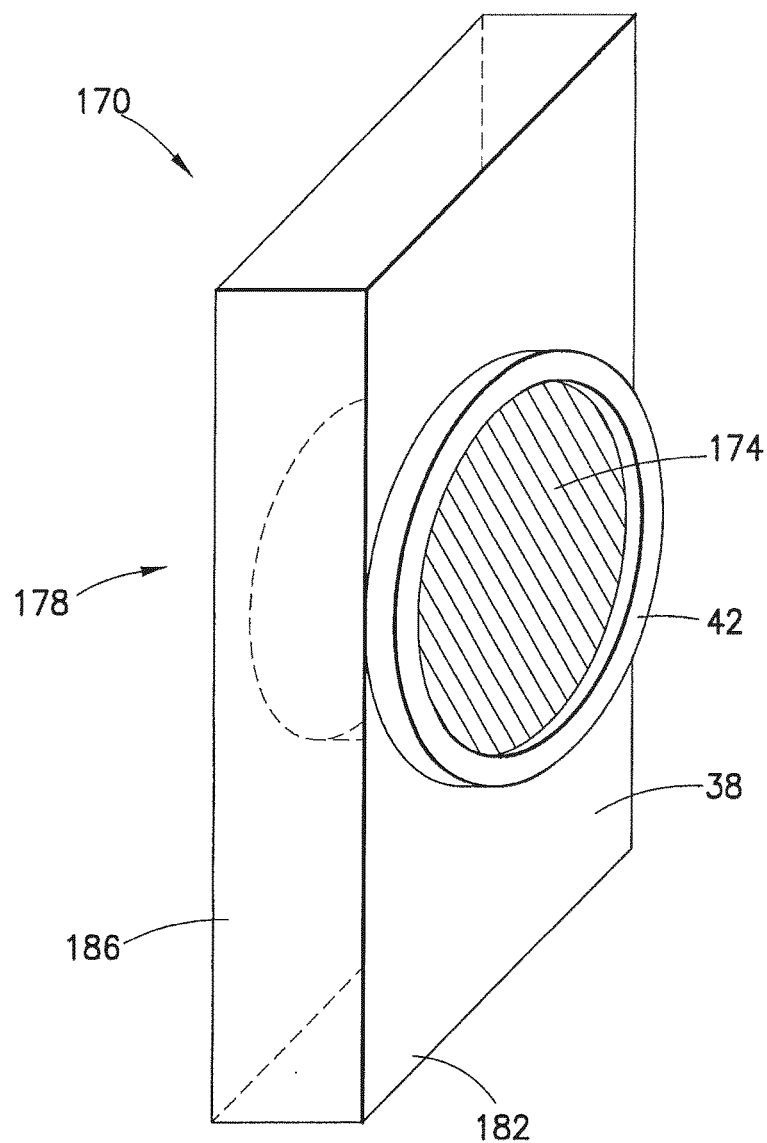
FIG. 9 depicts a perspective view of another exemplary workpiece holder including a hole bored through for processing a plurality of surfaces of a workpiece according to the invention.

FIG. 9 depicts another exemplary embodiment of a workpiece holder 170. This embodiment can be used to process a plurality of surfaces of the workpiece 30. The workpiece holder 170 includes a ring 42 for retaining the workplace. The body 174 of the workpiece holder 170 defines a hole 178 bored through from a first surface 182 to a second surface 186. The diameter of the hole 178 is smaller than the diameter of the ring 42. In various embodiments, the workpiece holder 18''' includes the features described above including, but not limited to, the member 58 or 58', the backing member 62, and the bladder 66. The underside of the workpiece 30 and the edge of the hole 178 can form a seal to isolate these components from the fluid used in the fluid processing.

Figure 10:
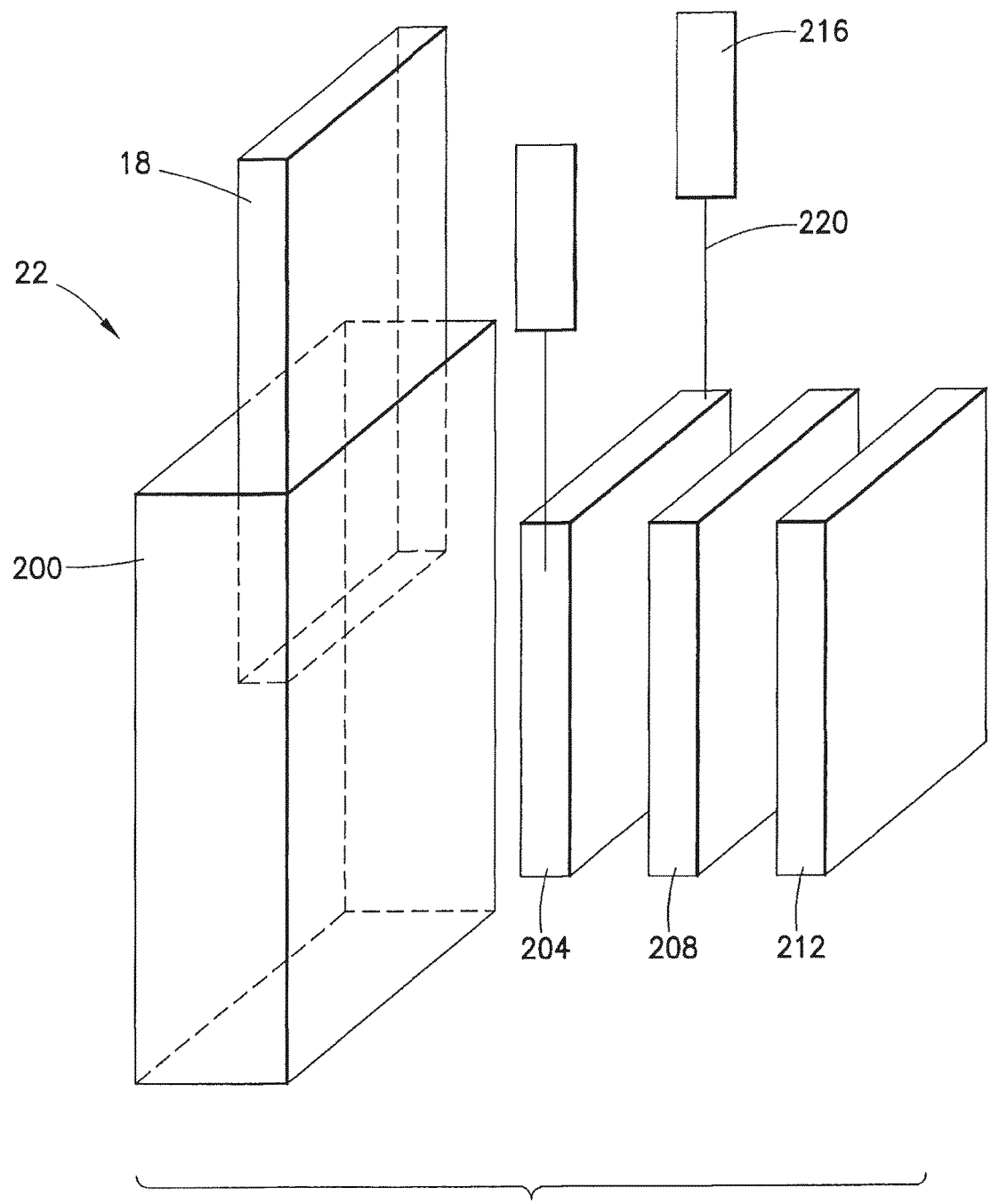
FIG. 10 shows an exploded view of an exemplary apparatus for processing a workpiece according to the invention.

FIG. 10 shows an exemplary apparatus for processing (e.g., fluid processing) a workpiece. The apparatus can include a module 22, which itself can include a housing 200. In one embodiment, the module 22 contains a fluid, e.g., the housing 200 defines a cavity in which the fluid can be disposed. As illustrated in FIG. 10, the apparatus also includes an embodiment of the workpiece holder 18, a member 204, a plate 208, and an anode 21 in some embodiments, one or more of these elements are not used or are not present. Variations are described in more detail below. In various embodiments, the member 204, the plate 208 and/or the anode 212 are disposed within the module 20 and/or the housing 200. Because of the modular design, these elements can be removably or fixably disposed within the housing 200.

In FIG. 10, the workpiece holder 18 is shown removed from the housing 200. The workpiece holder 18 need not be integrated with the module 22 or the housing 200. In one detailed embodiment, the workpiece holder 18 is removable from the housing 200. The workpiece holder 18 can be transportable between two or more modules 22. The housing 200 can include, grooves defined in the inner surface of two opposing sides. The edges 44 of the workpiece holder 18 or the guide strips 82 of the workpiece holder 18" can be inserted into the grooves.

An exemplary housing 200 can be less than about 180 mm in length for electrodeposition or electroetch applications. For applications that do not require a plate 208 or an anode 212, the length can be about 75 mm. The width of the housing 200 can be between about 300 mm and about 500 mm. In an exemplary embodiment for a 200 mm workpiece, the module dimensions can be about 180 mm by 400 mm, although the dimensions can vary depending on the application and/or workpiece size.

In various embodiments, the member 204 is a paddle assembly or a fluid agitation paddle. In one detailed embodiment, the member 204 is a SHEAR PLATE agitation paddle. The member 204 can be moved substantially parallel to a surface of a workpiece being retained by the workpiece holder 18. The member 204 can be moved with a non-uniform oscillatory motion to agitate the fluid in various embodiments, the oscillation frequency of the member 204 can be between about 0 Hz and about 20 Hz, although the frequency can be higher depending on the application. In one embodiment, the oscillation frequency of the member 204 is between about 4 Hz and about 10 Hz. In one detailed embodiment, the oscillation frequency is about 6 Hz.

In some embodiments, the member 204 is moved by one or more motors 216. The member 204 can be connected to the motor(s) 216 using connection rods 220. In one detailed embodiment, the motor(s) 216 are linear drive motors or a linear motor assembly. Suitable linear motors include linear drive motors available from the LinMot Corporation in Delavan, Wis. In various embodiments, the motors 216 can be fixably or removably attached to the housing 200. The motors 216 can be positioned on the center plane of the housing 200. In one detailed embodiment, the weight of the member 204 and the inertial forces incurred during reciprocating motion of the member 204 is supported by the linear motors via the magnetic field forces between the motor slider and the motor windings rather than by mechanical bearings. The one or more motors 216 can be computer controlled.

In various embodiments, the plate 208 can be a shield plate or shield assembly. The plate 208 can be used to shape the electric field incident on a surface of a workpiece being retained by the member 204. The plate 208' can be formed from a non-conducting materials. Suitable materials include, but are not limited to, HDPE and PVDF. In various embodiments, the plate 208 can have a circular shape, a substantially circular shape, or be non-circular (e.g., rectangular, square, oval, or triangular, or have another suitable geometric configuration). A feature of the plate 208 is that it can be removed and replaced with little effort. This allows a single module to be configurable for processing different sized workpieces with minimal lost production time.

In one embodiment, the anode 212 forms the outer wall of the housing 200. In one embodiment, the anode 212 can be a component of an anode assembly, which forms the outer wall of the housing 200. In various embodiments, the housing 200 has an outer wall and either the anode 212 or the anode assembly are removably attached the wall or spaced from the wall.

In various embodiments, the anode 212 can be a copper disk. In one embodiment, the exposed surface area of the anode 212 is about 300 $cm^2$. In one embodiment, the anode 212 is consumed during electrodeposition or another fluid process such as copper or solder deposition. One feature of the anode 212 is that it can be removed and replaced with little effort, minimizing lost production time.

In embodiments using an anode 212, the workpiece surface serves as the cathode. It is noted that in some embodiments, it is preferred that the polarity of the system is reversed. That is, the workpiece surface is controlled to be anodic relative to a cathode placed in the module 22. In such an embodiment, the anode 212 would be replaced by a cathode.

Figure 11:
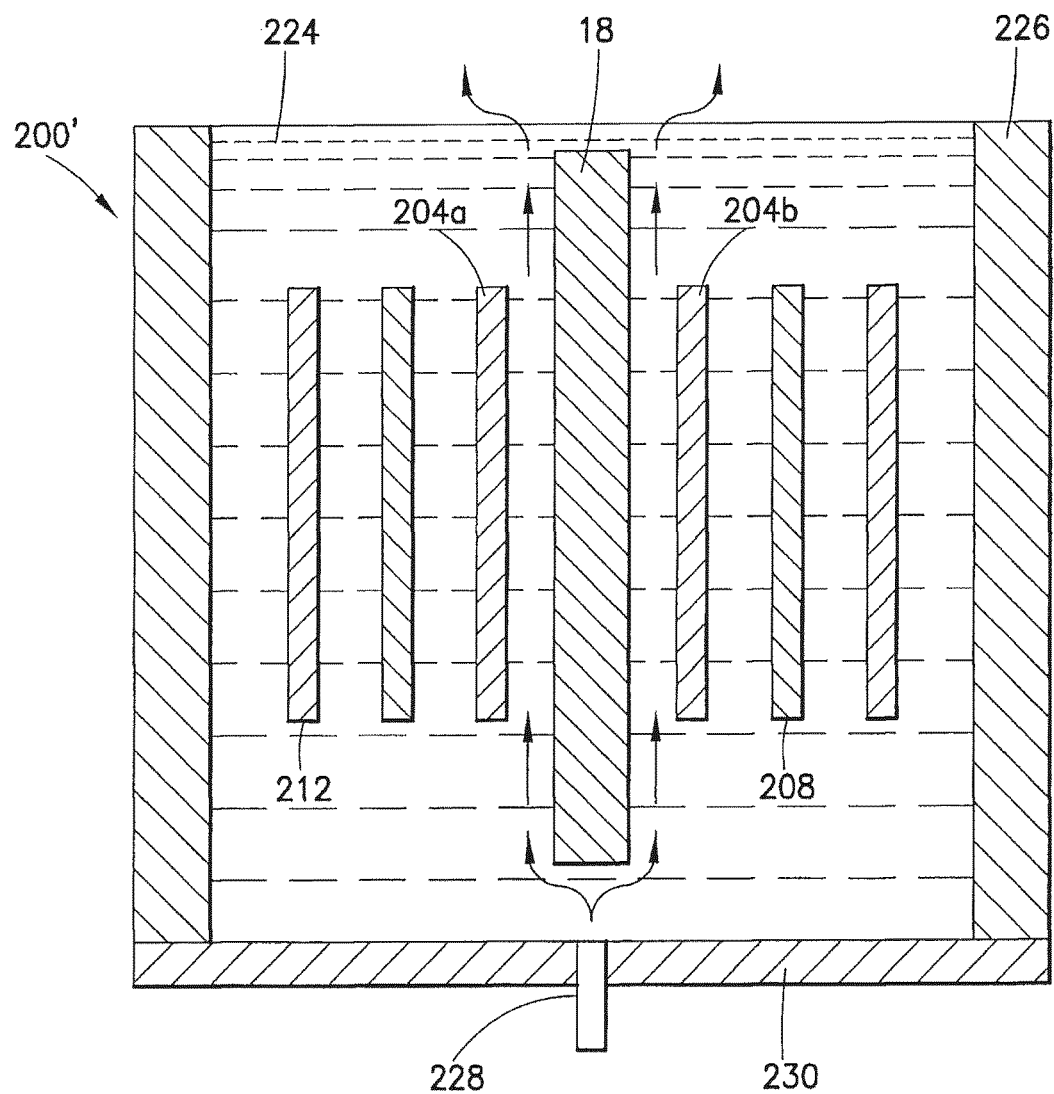
FIG. 11 depicts a sectional view of another exemplary embodiment of an apparatus for processing a workpiece according to the invention.

FIG. 11 shows cross-section of another exemplary embodiment of an apparatus for processing a workpiece. This embodiment can be used, for example, to process two workpieces simultaneously. A housing 200' includes a side wall 224 and end walls 226, and the relative positioning of members 202, members 204a and 204b, plates 203 and anodes 212 is shown. These elements or the distances are not shown to scale. Although the members 204a and 204b are shown as two separate structures, they can form a single assembly.

In an embodiment of the housing 200' for fluid processing, fluid enters the housing 200' through at least one port 228 in a bottom wall of the housing 200'. The port 223 can, in some embodiments, be located in a center portion, of the bottom wall 230 of the housing 200'. In one embodiment, the port 228 can be positioned in a bottom portion of a side wall 224. The fluid flows up along the surfaces of the one or more workpieces. The fluid can flow between the workpiece holder 18 and the respective member 204, 204a, or 204b or between the workpiece holder 18 and the plate 208. In various embodiments, the fluid exits the housing 200 through the top of the housing, through a top portion of a side wall 224, or through a top portion of an end wall 226. Arrows show the general direction of flow.

In various embodiments, the flow rate can be between about 20 liters per minute and about 40 liters per minute. In one detailed embodiment, the flow rate is about 28 liters per minute. In one embodiments, the fluid is an electrolyte. The electrolyte can be circulated through the housing 200' from a reservoir during the process. The turnover rate can be about 0.8 minutes at a flow rate of about 27.6 liters per minute. An exemplary solution can include copper sulfate, water, sulfuric acid, and hydrochloric acid.

The distance between a workpiece 30 and the respective member 204, 204a, or 204b can be about 1 mm and about 5 mm, although the distance can vary depending on the application. In one embodiment, the member 204, 204a, or 204b is positioned less than about 2 mm from the surface of the workpiece 30. The shorter the distance between the elements, the better is the fluid mixing at the surface. In a detailed embodiment where the ring 42 extends about 1 mm from the outer surface of the workplace, the member 204, 204a, or 204b can move in a plane about 1.5 mm from the surface of the workpiece 30. The plate 208 can be positioned between about 2 and about 20 mm from the surface of the workpiece 30, although the distance can vary depending on the application in one detailed embodiment, the plate 208 is positioned about 5 mm from the workpiece surface.

Figure 12:
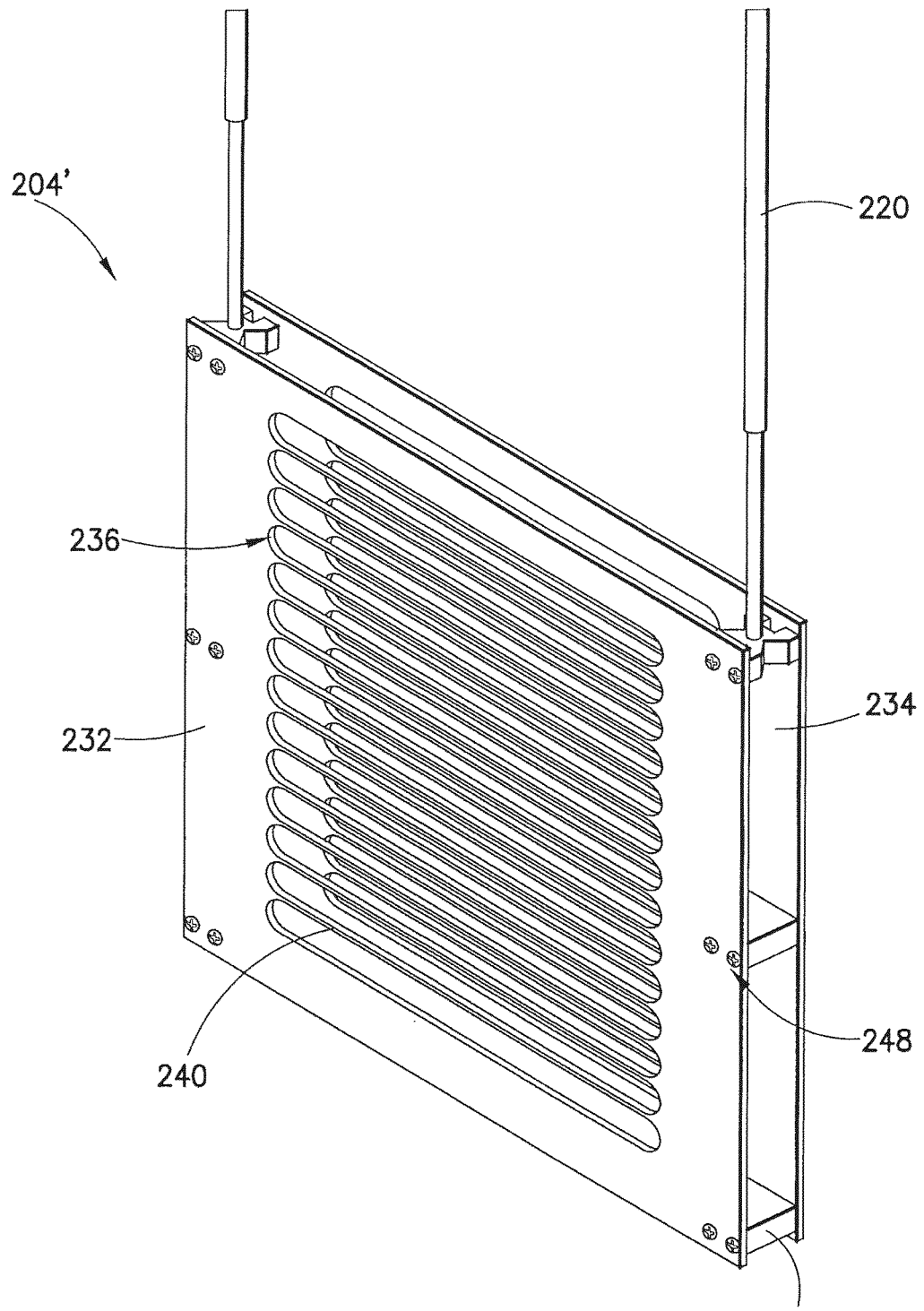
FIG. 12 depicts a perspective view of an exemplary embodiment of a member for agitating a fluid during fluid processing of a workpiece according to the invention.

FIG. 12 depicts a perspective view of an exemplary embodiment of a member 204' for agitating a fluid during fluid processing of a workpiece. The member 204' includes a first plate 232 and a second plate 234. Each plate 232 and 234 defines a series of spaced openings 236. The shape of the spaced openings 236 can be, for example, oval or rectangular. Each plate 232 and 234 can also include a series of spaced blades 240 for agitating the fluid. The profile of the spaced blades 240 can be straight, angled, cup-shaped, or square. The center points of the series of spaced openings 236 or the series of spaced blades 240 can be positioned in a substantially equidistant periodic array. For example, the centers can be positioned with about 10 to about 30 mm between them. In one detailed embodiment, the centers are position about 20 mm apart.

In one embodiment, the series of spaced openings 236 agitates the fluid when the member 204' is moved. In one embodiment, the series of spaced blades 240 agitates the fluid when the member 204' is moved. In one embodiment, both the openings 236 and the blades 240 agitate the fluid. In one detailed embodiment, an edge surface of a spaced blade 240 agitates the fluid.

The plates 232 and 234 can be formed from a suitable metal, plastic, or polymer. Suitable metals include titanium, stainless steel, or aluminum. Suitable plastics include polyvinyl chloride (PVC), chlorinated PVC (CPVC), HDPE, and PVDF. In various embodiments, either of the plates 232 and 234 can be positioned between about 2 mm and about 10 mm from the surface of the workpiece, although smaller or larger distances can be used depending on the application. In a detailed embodiment, the thickness of at least one of the plates 232 and 234 is between about 3 mm and about 6 mm, although smaller or larger distances can be used depending on the application and/or the construction of the material. Relatively thin pieces can be used so that the plate 208 can be positioned as close to the workpiece as possible. This improves the uniformity of deposition.

The first and second plates 232 and 234 can be joined by one or more spacer features 244 and to form the member 204'. In FIG. 12, the first and second plates 232 and 234 are shown attached to the spacer features 244 by screws 248, although other means may be used, including, but not limited to, rivets, glues, epoxies, adhesives, or outer suitable attachment means. The plates 232 and 234 and the spacer features 244 can define a cavity in which an embodiment of the workpiece holder 18 can be inserted during processing. The spacer features 244 can facilitate alignment of the member 204' to the workpiece holder 18.

In various embodiments, the member 204 or 204' can be aligned to the workpiece holder 18 by the housing 200 in a manner that offers high precision without requiring mechanical support of the member 204 or 204'. As described above, the motors 216 can support the member 204 or 204'. Precise and consistent separation between the member 204 or 204' and the workpiece holder 18 can be achieved using guide wheels (not shown) mounted on the housing 200. The guide wheels can turn freely on an axle that is securely mounted on a side wall, of the housing 200. Alignment wheels can also be mounted the housing 200 for positioning the workpiece holder 18. The relationship between the guide wheels and the alignment wheels can be such that the member 204 or 204' to the workpiece surface is consistent to within less than about ¼ mm. This promotes substantially uniform fluid boundary layer to occur at the workpiece surface when the member 204 or 204' is moved substantially parallel to the workpiece surface.

The axles for guide wheels can serve as journal bearing shafts. The member 204 or 204' can be moved with virtually zero frictional or bearing forces, which can significantly reduce repair and maintenance costs that are associated with systems that use load bearing frictional surfaces or bearings.

Figure 13:
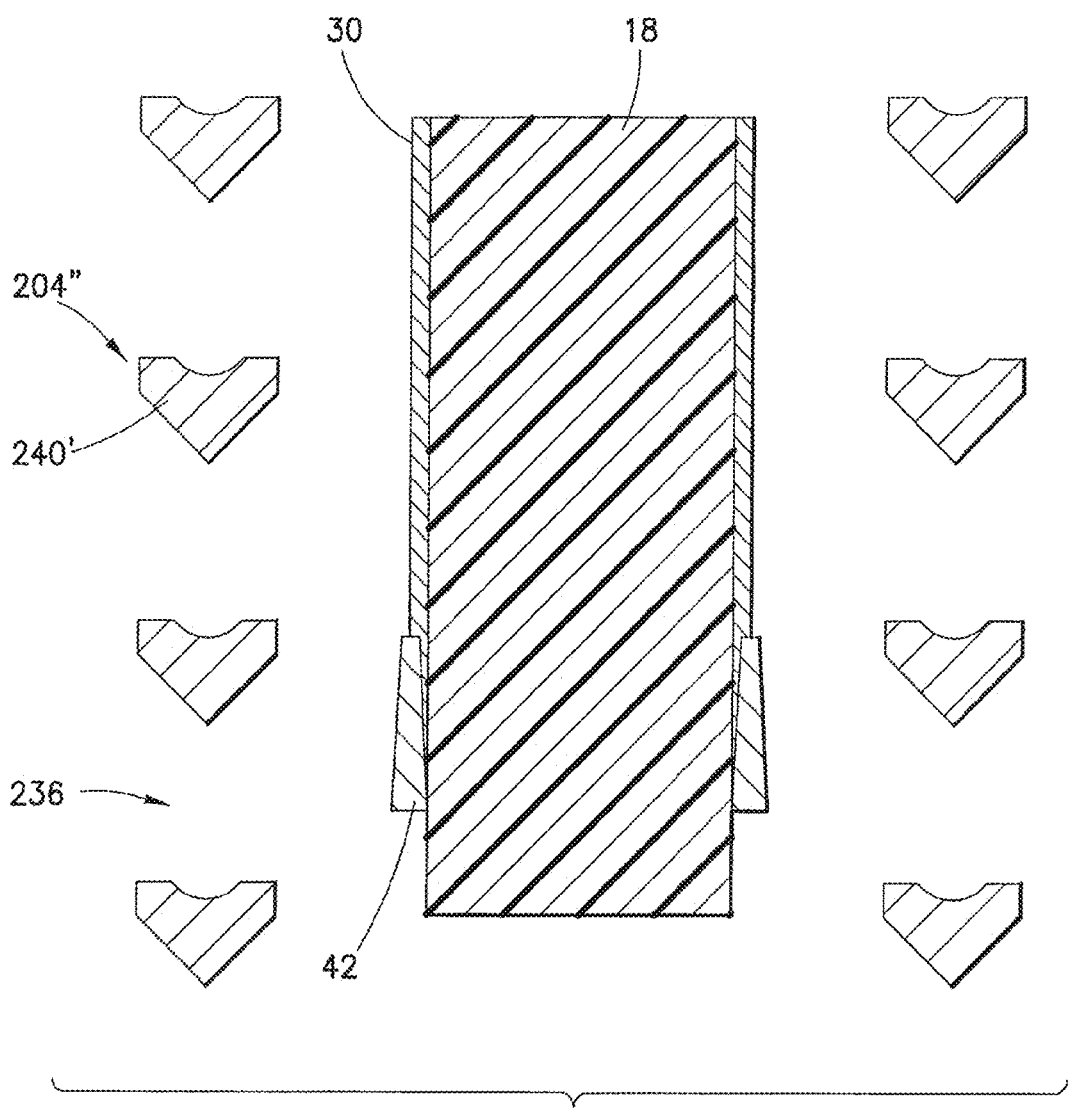
FIG. 13 shows a section view of another exemplary embodiment of a member for agitating a fluid during fluid processing of a workplace according to the invention.

FIG. 13 shows a cross-section of another exemplary embodiment of a member 204" for agitating a fluid during fluid processing of a workpiece. The spaced blades 240' have a cup shape. In FIG. 13, the spaced bladed 240' are shown adjacent the workpiece 30 being retained on the workpiece holder 18 using the ring 42. In various embodiments, the series of spaced openings 236 and/or the series of spaced blades 240' agitate the fluid when the member 204" is moved. In one embodiment, an edge surface of a spaced blade 240' agitates the fluid. In this embodiment, the edge surface can be a side surface, a pointed surface, or a rounded surface.

Figure 14:
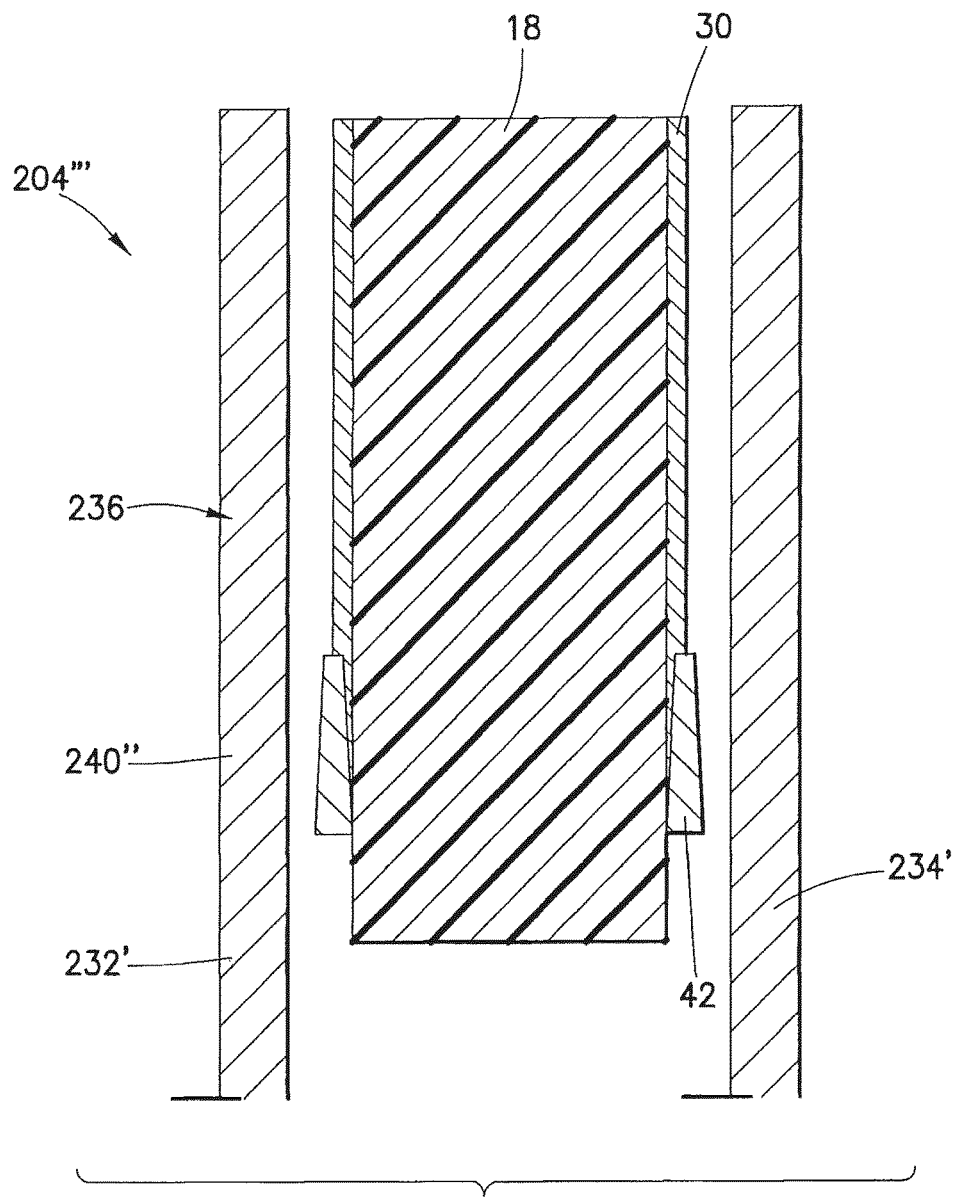
FIG. 14 shows a section view of another exemplary embodiment of a member for agitating a fluid during fluid processing of a workpiece according to the invention.

FIG. 14 shows a cross-section of another exemplary embodiment of a member 204'". The spaced blades 240" have an angled profile, and are shown adjacent the workpiece 30 being retained on the workpiece holder 18 using the ring 42. In various embodiments, the series of spaced openings 236 and/or the series of spaced blades 240" agitate the fluid when the member 204" is moved.

As described above, the member 204, 204', 204" or 204'" (referred to herein collectively as 204x) can be used to agitate the fluid. In some embodiments, the member 204x can be moved using a non-uniform oscillation profile. In one exemplary embodiment, the non-uniform oscillatory motion includes a reversal position that changes after each stoke of the non-uniform oscillatory motion.

Figure 15:
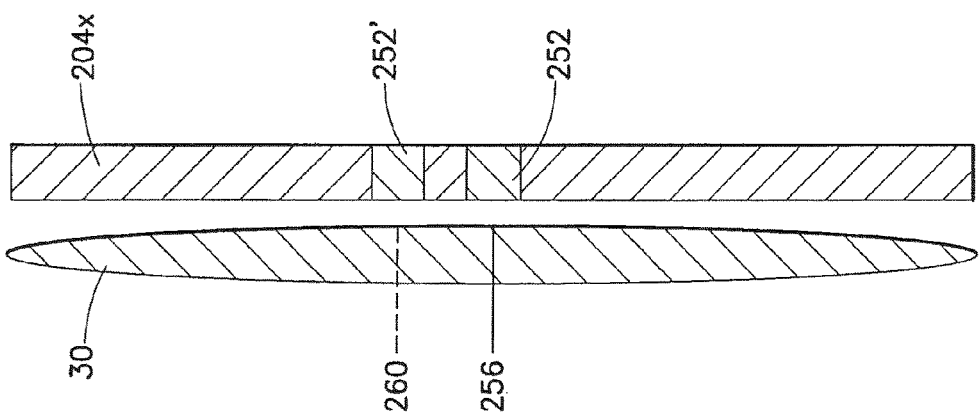
FIG. 15 depicts a diagrammatic representation of the position of a portion of a member for agitating a fluid adjacent a workpiece surface during a oscillatory motion according to the invention.

For example, referring to FIG. 15, a blade 240, 240', or 240" or a center point of a spaced opening 236 (referred to herein collectively as a center point 252) adjacent a particular workpiece point 256 on a surface of the workpiece 30 need not return to the same workplace point 256 after one complete oscillation stroke. The center point 252 can travel along the surface of the workpiece 30 as the member 204x oscillates, and after one complete oscillation stroke, the center point 252' can be at a nearby workpiece point 260.

In one embodiment, the non-uniform oscillatory motion includes a primary oscillation stroke and at least one secondary oscillation stroke. The length of the primary oscillation stroke can be substantially the same as the separation of the spaced openings 236 defined by the member 204x. In one detailed embodiment, the length of the primary oscillation stroke can be substantially the same as the separation of adjacent spaced openings 236.

Figure 16:
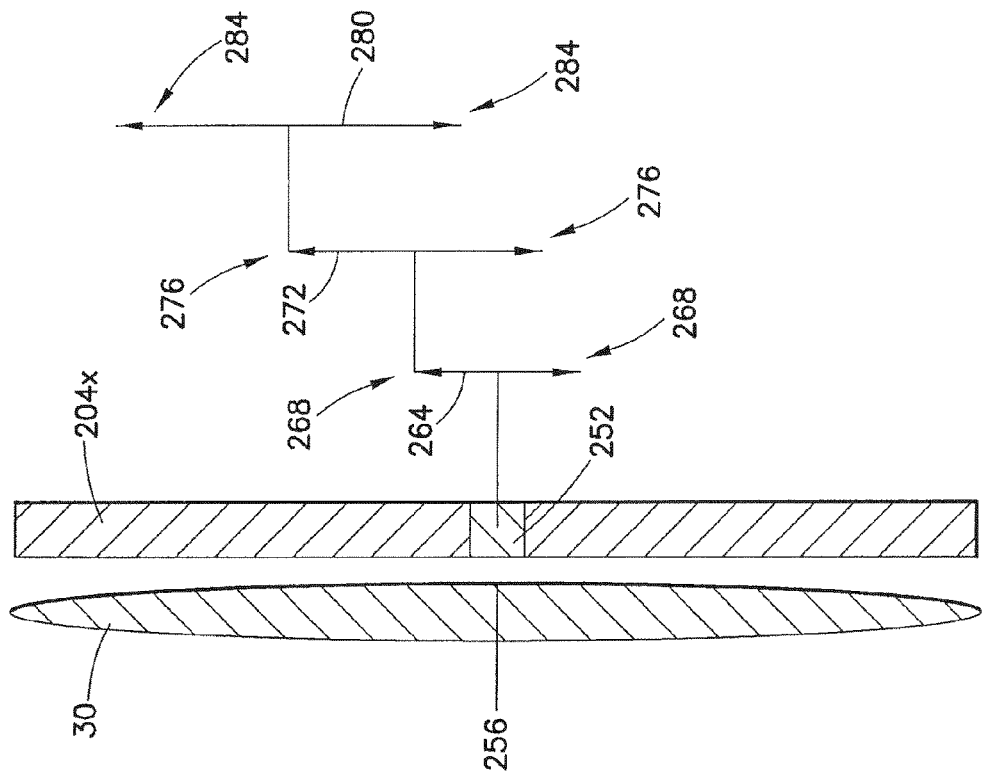
FIG. 16 shows a diagrammatic representation of oscillatory motion of a portion of a member adjacent a workpiece surface for agitating a fluid according to the invention.

Referring to FIG. 16, an exemplary primary oscillation stroke 264 can change a reversal position of an oscillation stroke of the member 204x. In one detailed embodiment, the primary oscillation stroke 264 changes a reversal position 268 of the center point 252 of the member 204x. An exemplary first secondary oscillation stroke 272 can change a reversal position of an oscillatory motion of the member 204x. In one detailed embodiment, the first secondary oscillation stroke 272 changes a reversal position 276 of the center point 252. In various embodiments, this can also be understood as changing a reversal, position of the primary oscillation stroke 264. An exemplary second secondary stroke 280 can change a reversal position of an oscillatory motion of the member 204x. In one detailed embodiment, the second secondary stroke 230 changes a reversal position 284 of the center point 252. In various embodiments, this can also be understood as changing a reversal position of the first secondary oscillation stroke 272.

As illustrated, a center point 252 is used to show the relative motion of the member 204x. Any point X along the surface of the member 204x, though, can be used to show the change in reversal position of that point X as the member 204x moves. In some embodiments, the member can be formed from a plurality of pieces. Each piece includes one or more spaced openings or one or more spaced blades. In one embodiment, each piece can be connected to a separate motor so that its motion is independent of a proximate piece. In one embodiment, each piece can be connected to the same motor so that the pieces move in concert. In some embodiments, the plurality of pieces is positioned on the same side of a workpiece so that the motion of two or more pieces of the member 204x agitates the fluid.

Figure 17:
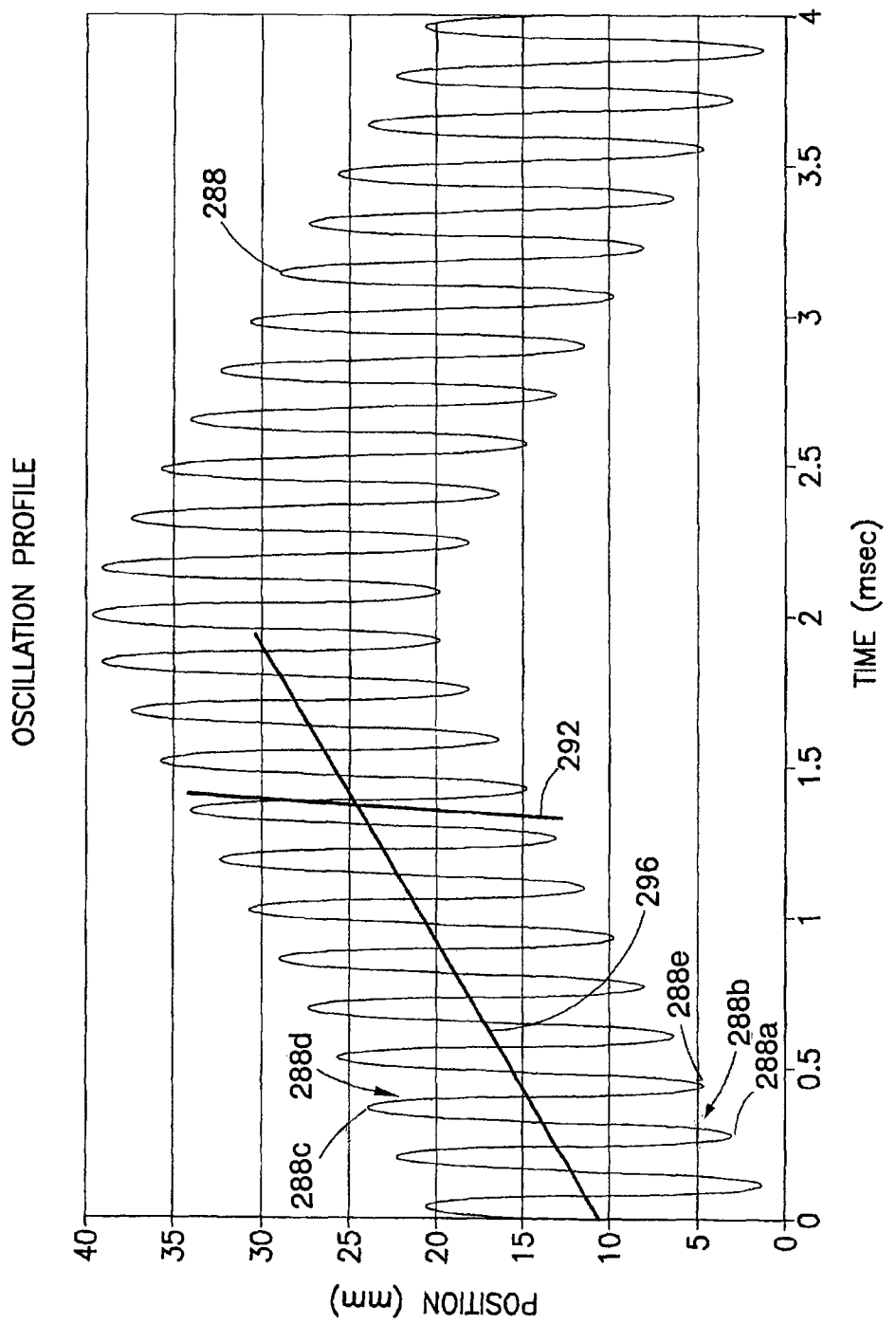
FIG. 17 shows a graphical view of an exemplary non-uniform oscillation profile for agitating a fluid during fluid processing of a workpiece according to the invention.

FIG. 17 shows a graphical representation of an exemplary non-uniform oscillation profile 288 for agitating a fluid during fluid processing of a workplace. The exemplary workpiece 30 and center point 252 in FIGS. 15 and 16 are referenced for illustrative purposes. The position of the center point 252 of the member 204x relative to the work-piece point 256 on the surface of the workpiece 30 is plotted versus time. In this embodiment of the member 204x, the separation of the center points 252 is about 20 mm. The primary oscillation stroke is substantially the same as the separation between the center point 252 and an adjacent center point of the member 204x. The secondary oscillation, stroke is about 40 mm. Line 292 shows the relative travel of the center point as a result of the primary oscillation stroke. Line 2965 shows the relative travel of the center point as a result of the secondary oscillation stroke. As may be realized from FIG. 17, the resultant non-uniform oscillation profile is formed by a series of oscillations with each consecutive oscillation in the series being asymmetric.

By using a combination of primary and secondary strokes, the reversal position of the oscillation pattern in front of the workpiece 30 can change sufficiently relative to the process time. This can preclude a non-uniform time averaged electric field or fluid flow field on the surface of the workpiece. This can minimize an electric field image or a fluid flow image of the member on the surface of the workpiece, which improves the uniformity of a deposition.

Figure 18:
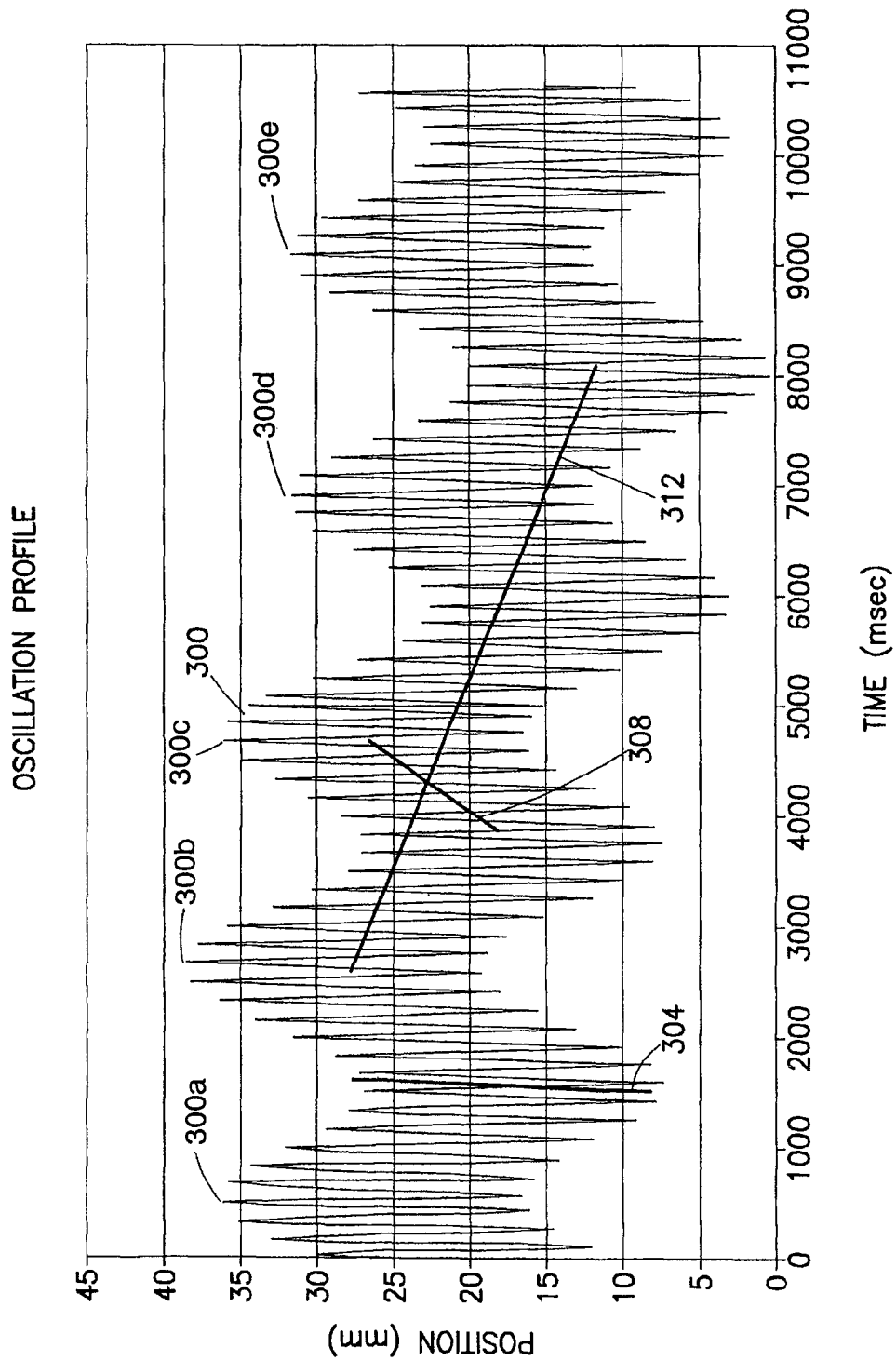
FIG. 18 depicts a graphical view of another exemplary non-uniform oscillation profile for agitating a fluid during fluid processing of a workpiece according to the invention.

FIG. 18 shows a graphical representation of another exemplary non-uniform oscillation profile 300 for agitating a fluid during fluid processing of a workpiece. In this embodiment of the member 204x, the separation of the center points 252 is about 20 mm. The primary oscillation stroke is substantially the same as the separation between the center point 252 and an adjacent center point of the member 204x. The first secondary oscillation stroke is about 30 mm. The second secondary oscillation stroke is about 40 mm. The oscillatory motion can include additional secondary oscillation strokes.

Line 304 shows the relative travel of the center point as a result of the primary oscillation stroke. Line 308 shows the relative travel, of the center point as a result of the first secondary oscillation stroke. Line 312 shows the relative travel of the center point as a result of the second secondary oscillation stroke.

The period of the first secondary oscillation stroke is about 2 seconds, and the period of the second secondary oscillation stroke is about 10 seconds. This can move the position at which the oscillation reversal occurs, which can spread the reversal point of each spaced blade or the center point of each spaced opening by about 0.1 mm. This can reduce or substantially eliminate any imaging of the reversal position onto the workpiece surface.

Oscillation of the member 204x can also form a non-periodic fluid boundary layer at the surface of the workpiece 30. In one embodiment, the member 204x reduces fluid boundary layer thickness at the surface of the workpiece 30. In one detailed embodiment, the fluid boundary layer thickness is reduced to less than about 10 μm. Furthermore, motion of the member can reduce or substantially eliminate entrapment of air or gas bubbles in the fluid from the surface of the workpiece 30. In one detailed embodiment, fluid flow carries the air or gas bubbles near a growing film surface in a housing 200 for plating or depositing.

Figure 19:
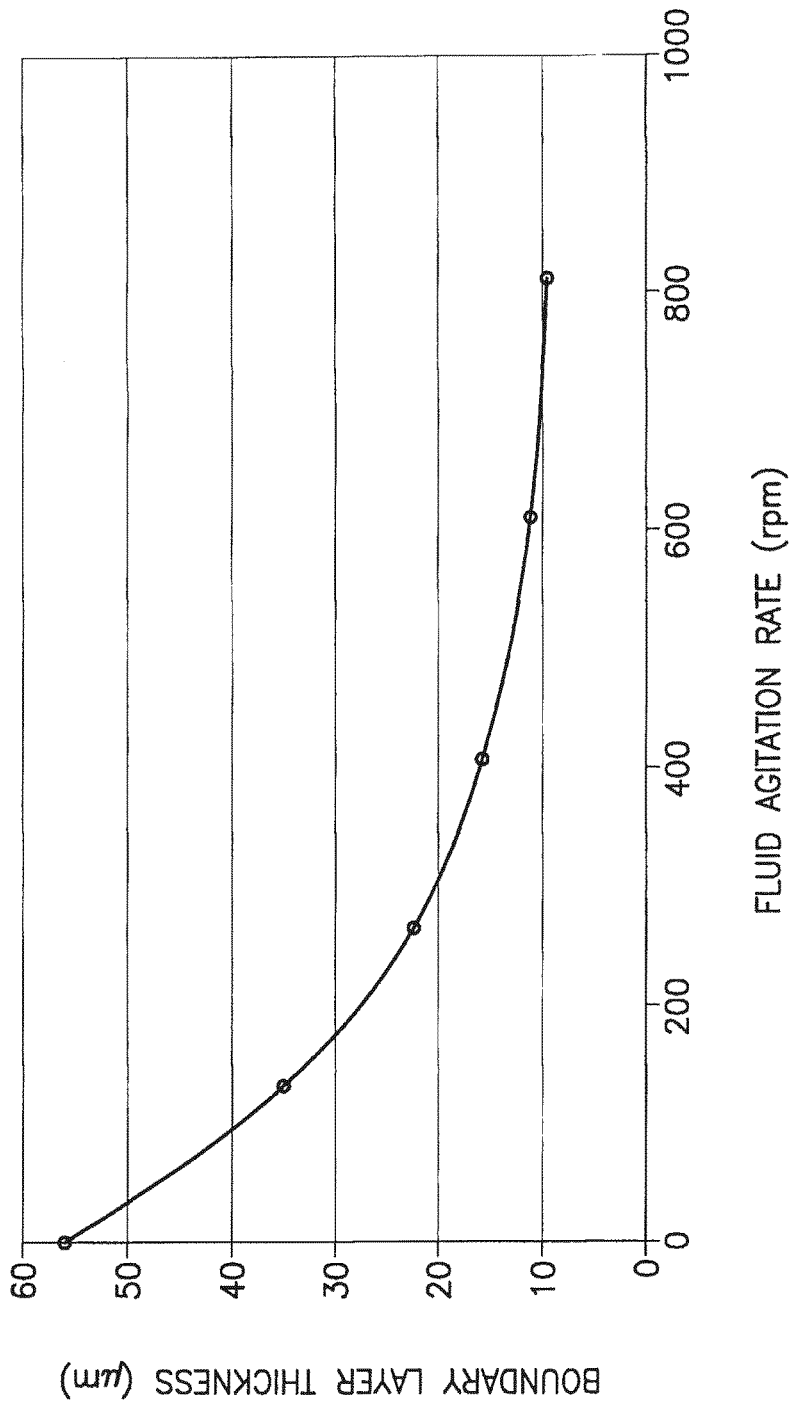
FIG. 19 shows a graphical view of boundary layer thickness versus fluid agitation speed according to the invention.

FIG. 19 illustrates a graphical representation of boundary layer thickness at a surface of a workpiece versus fluid agitation rate. The fluid agitation rate can be the oscillation rate of the member 204x. As illustrated, the fluid boundary layer thickness is reduced from about 55 μm to less than about 10 μm as the rate is increased. The boundary layer can be derived from limiting current measurements, which can be determined by comparison to known behavior of a reference electrode, by linear sweep voltammetry, or by chronoamperometry. Fluid mixing is inversely proportional to the boundary layer thickness. Therefore, decreasing the boundary layer in a fluid process can improve fluid mixing at a workpiece surface. This can improve throughput and uniformity, and can also decrease materials consumption.

FIG. 20 depicts an exemplary embodiment of a plate 208' for varying an electric field during processing of a workpiece 30. Varying the electric field at the workpiece surface can promote uniform deposition of a film, although the electric potential drop through the workpiece surface varies from the workpiece perimeter to the workpiece center. In one embodiment, the plate 208' is fabricated from a non-conducting material that can block the electric field as it passes from the plane of the anode 212 to the plane of surface of the workpiece 30. The plate 208' has a substantially circular shape. The plate 208' can include fastening holes 314 for connecting the plate 208' to the housing 200 or 200', or to a support feature (not shown) that suspends the plate 208' in the housing 200 or 200'.

In one embodiment, the plate 208 (shown in FIGS. 10 and 11) or 208' (shown in FIG. 20) shapes the electric field incident on a surface of the workpiece 30. A body 316 of the plate 208 or 208' can define a plurality of holes 320. The holes 320 can have a distribution of hole sizes, e.g., the diameter of the holes can vary on a surface of the plate. By varying the distribution of hole sizes, the average open area of a surface of the plate 208 or 208' can be varied, and a property of the electric field passing through the plate 208 or 208' to the surface of the workpiece 30 can be varied. The property of the electric field that is varied can be amplitude or potential. In various embodiments, the electric field proximate to the surface of the workpiece can be uniform.

In one embodiment, the distribution of hole sizes comprises a continuous gradient of hoe size. In one detailed embodiment, the holes vary in a substantially radial pattern. For example, as illustrated in FIG. 20, larger holes can be formed near the center of the plate 208' while smaller holes are formed closer to the outer perimeter of the plate 208'. In various embodiments, the plate can have between about 500 and about 10,000 holes, although more or fewer holes can be used depending on the application and/or the workpiece size. In one embodiment, the plate can have between about 1,000 and about 5,000 holes. In one detailed embodiment, the plate 208 or 208' can have about 3000 holes and be suitable for a 200 mm workpiece. In various embodiments, the diameter of the holes is between about 0.1 mm and about 20 mm, although larger and smaller diameter holes can be used depending on the application. In one embodiment, the largest diameter holes can be about 5 mm in diameter. The smallest diameter holes can have a diameter of about 1 mm.

Figure 21A:
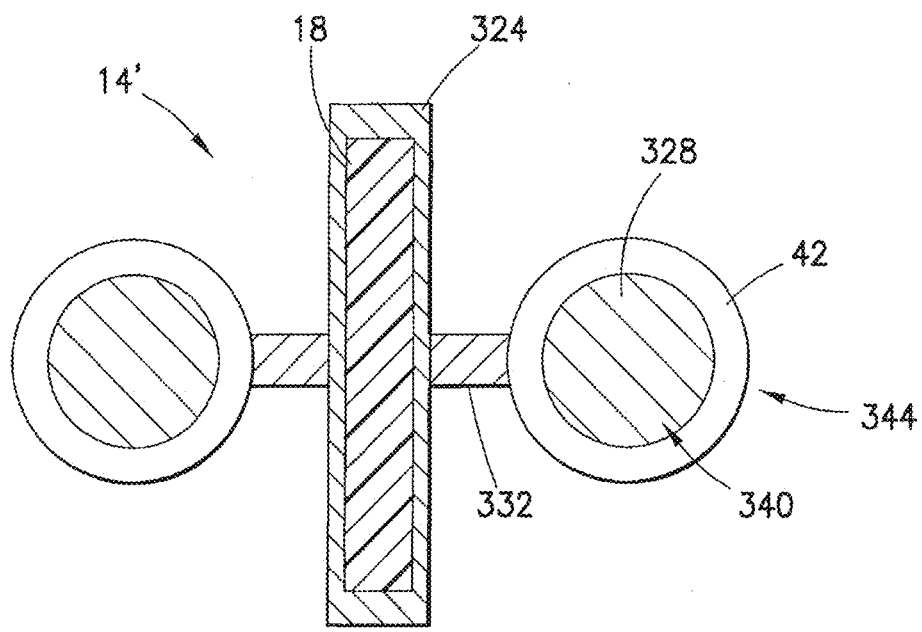
FIG. 21A shows a plan view of an exemplary loading station for workpieces according to the invention.
Figure 21B:
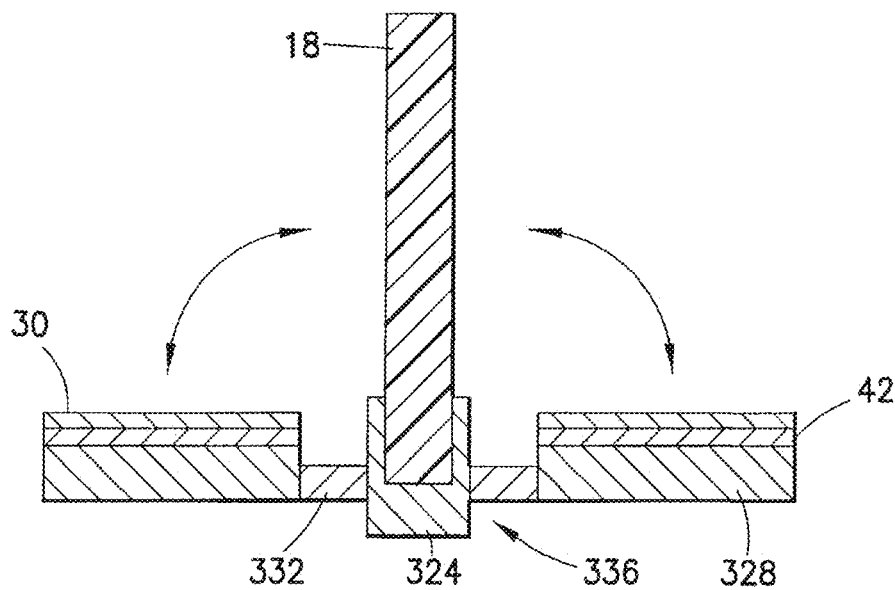
FIG. 21B shows a side view of the loading station depicted in FIG. 21A.

FIGS. 21A and 21B show an illustrative embodiment of a loading station 14', which can be used to load one or more workpieces 30 on an embodiment of the workpiece holder 18. FIGS. 21A and 21B include a holder 324 for the workpiece holder 13, a base member 328 for moving a workpiece 30, and an arm 332 connecting the holder 324 and the base member 328. FIG. 21B shows workpieces 30 loaded onto the base member 328. The arm 332 and the holder 324 can include a hinged connection 336 so that the arm 332 can move the base member 328 between a substantially horizontal position and a substantially vertical position, or to an intermediate position. The base member 328 and the arm 332 can be components of the same piece.

The holder 324 can retain the workpiece holder 18 while workpieces 30 are being loaded onto or removed from the workpiece holder 18. In some embodiments, the holder 324 can retain the workpiece holder 18 while workpieces 30 are being loaded onto or removed from the base member 328. The holder 324 can be a suitable metal, plastic, or polymer material. A second end effector (not shown) can be used to load a workpiece 30 onto the base 328. The loading station 14' can be coupled to a hydraulic mechanism and/or a computer to control the position of the arm 332.

In various embodiments, the base member 328 can include an end effector 340 positioned in the central portion of the base member 328 and a chuck 344 positioned around the outer perimeter of the base member 323. The end effector 340 can be a Bernoulli end effector, an electrostatic chuck, or a vacuum end effector. The end effector 340 can retain a workpiece 30 without contacting it. In some embodiments, the chuck 344 is a vacuum chuck or a suction chuck. The chuck 344 can retain the ring 42 on the base member 328. In one embodiment, the end effector 340 can retain the workpiece 30 against the ring 42 while the workpiece 30 is loaded onto or removed from the workpiece holder 18. In one embodiment, the end effector 340 can retain the workpiece 30 against the ring 42 without contacting the workpiece 30.

In one embodiment, to load a workpiece 30 onto the workpiece holder 18, the ring 42 is engaged by the chuck 344. The workpiece 30 can be placed on the ring 42. The end effector 340 can be activated to hold the workpiece 30 against the ring 42. The arm 332 can be moved to a substantially vertical position ice workpiece holder 18 can engage the ring 42. The end effector 340 can be disengaged from the workpiece 30, and the chuck 344 can be disengaged from the ring 42. The arm 332 can be moved from the plane of the workpiece holder 13 so that there is clearance. The workpiece holder 18 can be removed from the holder 324 and directed to a module for processing. The steps need not be completed in this order to load the workpiece 30.

In one embodiment, to remove a workpiece 30 from the workpiece holder 18, the arm 332 can be moved to a substantially vertical position. The end effector 340 can engage the workpiece 30, and the chuck 344 can engage the ring 42. The ring 42 is disengaged from the workpiece holder 18. The arm 332 can be moved to a substantially horizontal position. The steps need not be completed in this order to remove the workpiece 30.

The loading station 14' can load a single workpiece 30 to a workpiece holder 18, or can load a plurality of workpieces 30 to a workpiece holder 18. In one embodiment, two workpieces are loaded onto the workpiece holder 18 substantially concurrently. In one embodiment, two workpieces are removed from the workpiece holder 18 substantially concurrently. In some embodiments, a first workpiece is loaded onto or removed from the workpiece holder 18 before a second workpiece is loaded or removed.

While the invention has been particularly shown and described with reference to specific illustrative embodiments, it should be understood that various changes in form and detail may be made without departing from the spirit and scope of the invention as defined by the appended claims. For example, although specific actions, movements, and processes may be described with reference to specific embodiments, these actions, movements, and processes may be performed by any embodiment employing like or similar features. Likewise, although the invention, in some embodiments, is described as a system employing individual features, some of the features can be utilized independent of the system.

What is claimed is:

1. A method of fluid processing a semiconductor workpiece, comprising:
   disposing a workpiece holder with a housing capable of containing a fluid, the workpiece holder retaining the workpiece;
   providing an agitation system connected to the housing and comprising a member disposed within the housing adjacent the workpiece holder; and
   agitating the fluid by moving the member substantially parallel to a surface of the workpiece with an oscillatory motion, the oscillatory motion being a series of substantially continuous oscillations, wherein each consecutive oscillation of the series includes a first stroke and an opposing second stroke and wherein the first stroke includes a starting point and an ending point, and the second stroke includes a starting point and an ending point, and the ending point of the first stroke coincides with the starting point of the second stroke to thereby define a reversal position, and further wherein the second stroke is not symmetrical to the first stroke with respect to the reversal position such that each oscillation is asymmetrical, and further wherein the starting point of the first stroke is offset from the ending point of the second stroke.

2. The method of claim 1 further comprising continuously changing a center position of each stroke such that a center of the first stroke is offset from a center of the second stroke, and centers of each of a plurality of immediately succeeding strokes are offset from centers of each of their respective immediately preceding strokes.

3. The method of claim 1 further comprising matching the length of the first stroke to the separation of spaced openings defined by the member.

4. The method of claim 1 further comprising reducing electric field imaging of the member on the surface of the workpiece via the oscillatory motion.

5. The method of claim 1 further comprising reducing fluid flow imaging of the member on the surface of the workpiece via the oscillatory motion of the member.

6. The method of claim 1 further comprising shaping an electric field incident on a surface of the workpiece using a plate disposed adjacent the member.

7. The method of claim 1 further comprising removing gas bubbles entrapped in the fluid from the surface of the workpiece.

8. The method of claim 1 further comprising forming a non-periodic fluid boundary layer at a surface of the workpiece via the oscillatory motion of the member.

9. The method of claim 1 further comprising reducing a fluid boundary layer thickness at the surface of the workpiece via the oscillatory motion of the member.

10. The method of claim 9 further comprising reducing the fluid boundary layer thickness to less than about 10 μm.

11. The method of claim 1 further comprising positioning the member less than about 2 mm from a surface of the workpiece.

12. The method of claim 1 further comprising depositing a metal or plastic on a surface of the workpiece.

13. The method of claim 1 further comprising dissoluting a metal or a plastic on a surface of the workpiece.

14. The method of claim 1 wherein the member defines a plurality of spaced openings.

15. The method of claim 14 further comprising agitating the fluid using oscillatory motion of the plurality of spaced openings of the member.

16. The method of claim 1, wherein a first plurality of oscillations form a first cycle of oscillations, and wherein said first cycle includes a first maximum reversal position, in which reversal positions immediately before and immediately after the first maximum reversal position are lower than the first maximum reversal position;
   wherein a second plurality of oscillations form a second cycle of oscillations, and wherein said second cycle of oscillations includes a second maximum reversal position, in which reversal positions immediately before and immediately after the second maximum reversal position are lower than the second maximum reversal position; and
   wherein said first maximum reversal position is offset from said second maximum reversal position.

17. The method of claim 16, wherein successive cycles of oscillations each have a maximum reversal position which is offset from a respective maximum reversal position of an immediately preceding cycle.

18. A method for fluid processing a semiconductor workpiece, comprising:
   disposing a means for retaining the workpiece in a housing capable of containing fluid;
   providing a means for agitating the fluid; and
   moving the means for agitating the fluid in an oscillatory motion substantially parallel to a surface of the workpiece, the oscillatory motion being a series of substantially continuous oscillations including a first oscillation having a first stroke and an opposing second stroke, and wherein the first stroke includes a starting point and an ending point, and the second stroke includes a starting point and an ending point; and
   wherein the ending point of the first stroke corresponds to the starting point of the second stroke and thereby provides a stroke reversal position of the first oscillation;
   wherein the starting point of the first stroke is offset from the ending point of the second stroke;
   wherein the substantially continuous oscillations further include a second oscillation immediately following the first oscillation, the second oscillation including a third stroke and an opposing fourth stroke, the third stroke having a starting point corresponding to the ending point of the second stroke, the third stroke having an ending point corresponding to a starting point of the fourth stroke to thereby provide a stroke reversal position of the second oscillation, and wherein the fourth stroke includes an ending point;
   wherein the starting point of the third stroke is offset from the ending point of the fourth stroke; and
   wherein the reversal position of the first oscillation is offset from the reversal position of the second oscillation.

19. The method of claim 18, further comprising providing a means defining a plurality of holes having a distribution of hole sizes for varying an electric field incident on the surface of the workpiece.

20. The method of claim 18, wherein a first plurality of oscillations form a first cycle of oscillations, and wherein said first cycle includes a first maximum reversal position, in which reversal positions immediately before and immediately after the first maximum reversal position are lower than the first maximum reversal position;
   wherein a second plurality of oscillations form a second cycle of oscillations, and wherein said second cycle of oscillations includes a second maximum reversal position, in which reversal positions immediately before and immediately after the second maximum reversal position are lower than the second maximum reversal position; and
   wherein said first maximum reversal position is offset from said second maximum reversal position.

* * * * *